United States Patent
Suzuki et al.

(10) Patent No.: US 9,905,306 B2
(45) Date of Patent: Feb. 27, 2018

(54) SEMICONDUCTOR STORAGE DEVICE

(71) Applicant: TOSHIBA MEMORY CORPORATION, Minato-ku (JP)

(72) Inventors: Yuichiro Suzuki, Yokohama (JP); Noboru Ooike, Yokohama (JP); Masashi Yoshida, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/455,970

(22) Filed: Mar. 10, 2017

(65) Prior Publication Data
US 2017/0271025 A1    Sep. 21, 2017

(30) Foreign Application Priority Data
Mar. 15, 2016    (JP) .................... 2016-051123

(51) Int. Cl.
| | | |
|---|---|---|
| G11C 16/34 | (2006.01) | |
| G11C 16/04 | (2006.01) | |
| G11C 16/10 | (2006.01) | |
| G11C 16/08 | (2006.01) | |
| G11C 16/26 | (2006.01) | |
| G11C 11/56 | (2006.01) | |
| G11C 16/12 | (2006.01) | |

(52) U.S. Cl.
CPC ...... *G11C 16/3459* (2013.01); *G11C 16/0483* (2013.01); *G11C 16/08* (2013.01); *G11C 16/10* (2013.01); *G11C 16/26* (2013.01); *G11C 11/5628* (2013.01); *G11C 16/12* (2013.01)

(58) Field of Classification Search
CPC ...... G11C 16/10; G11C 11/5628; G11C 16/12
USPC ..................................... 365/185.19
See application file for complete search history.

(56) References Cited

U.S. PATENT DOCUMENTS

| | | | |
|---|---|---|---|
| 6,665,214 B1 * | 12/2003 | Cheah .............. | G11C 29/02 365/185.19 |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2011/0284946 A1 | 11/2011 | Kiyotoshi | |
| 2014/0247664 A1 | 9/2014 | Hosono et al. | |

FOREIGN PATENT DOCUMENTS

JP    2014-170597    9/2014

* cited by examiner

*Primary Examiner* — Jason Lappas
(74) *Attorney, Agent, or Firm* — Oblon, McClelland, Maier & Neustadt, L.L.P.

(57) ABSTRACT

According to one embodiment, a semiconductor storage device includes: a NAND string with a first set of memory cells including a first memory cell; and a second set of memory cells including a second memory cell disposed above the first memory cell. The number of memory cells included in the first set is different from that of memory cells included in the second set. During a program verify operation when a data item of a level is written to a memory cell of the first set and a memory cell of the second set, a first verify voltage is applied to the gate of the memory cell of the first set and a second verify voltage different from the first verify voltage is applied to the gate of the memory cell of the second set.

12 Claims, 23 Drawing Sheets

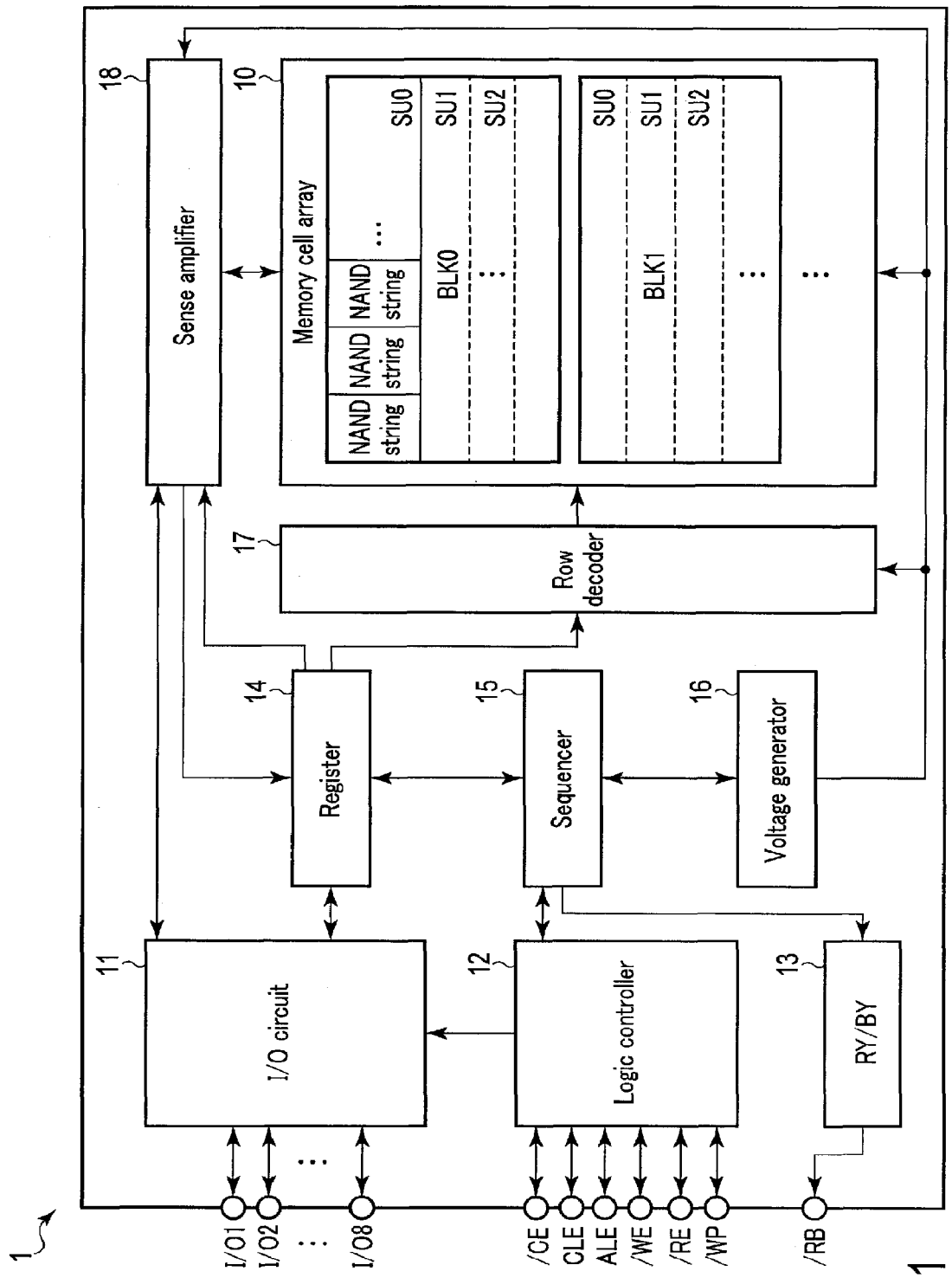
F I G. 1

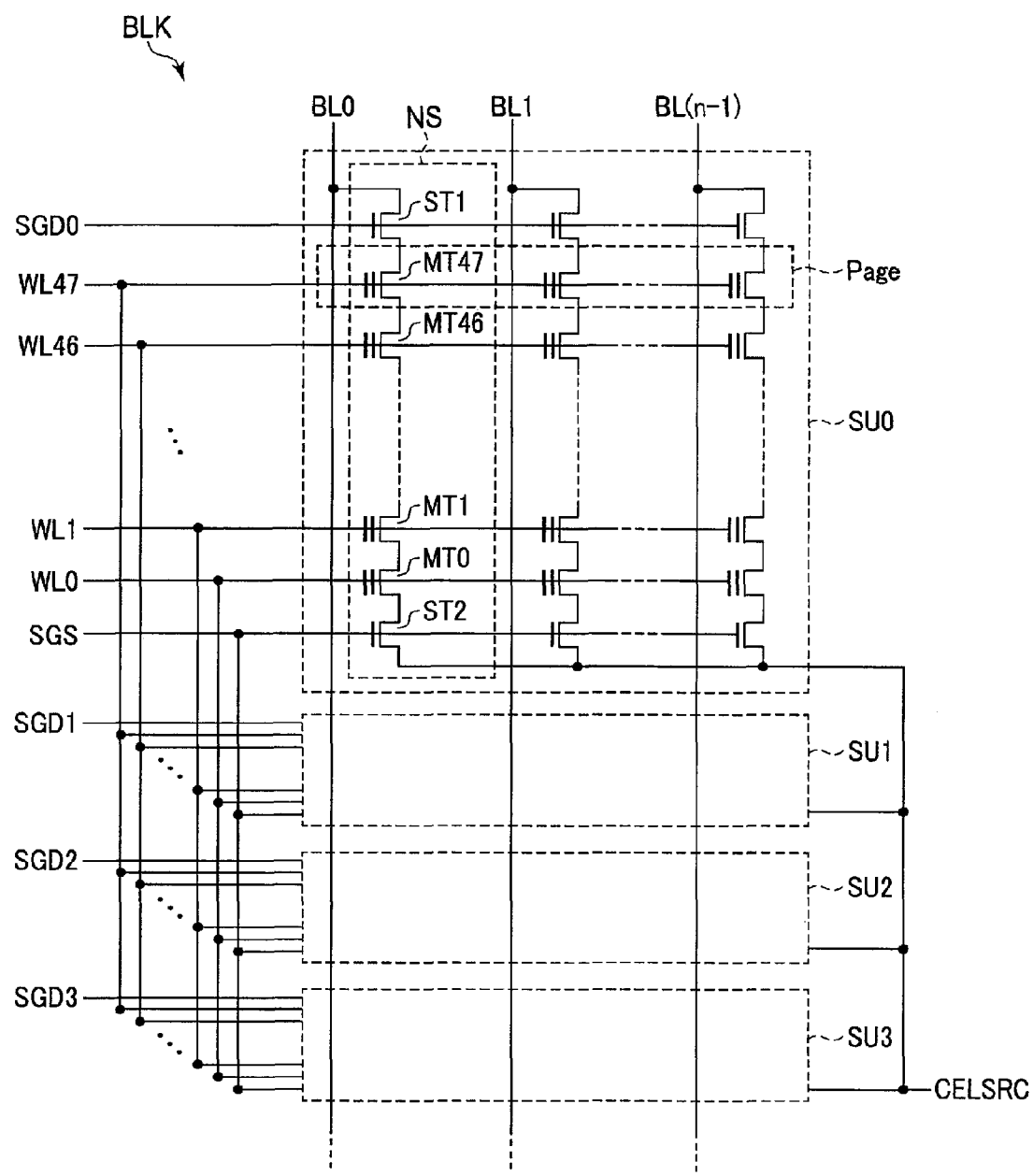
F I G. 2

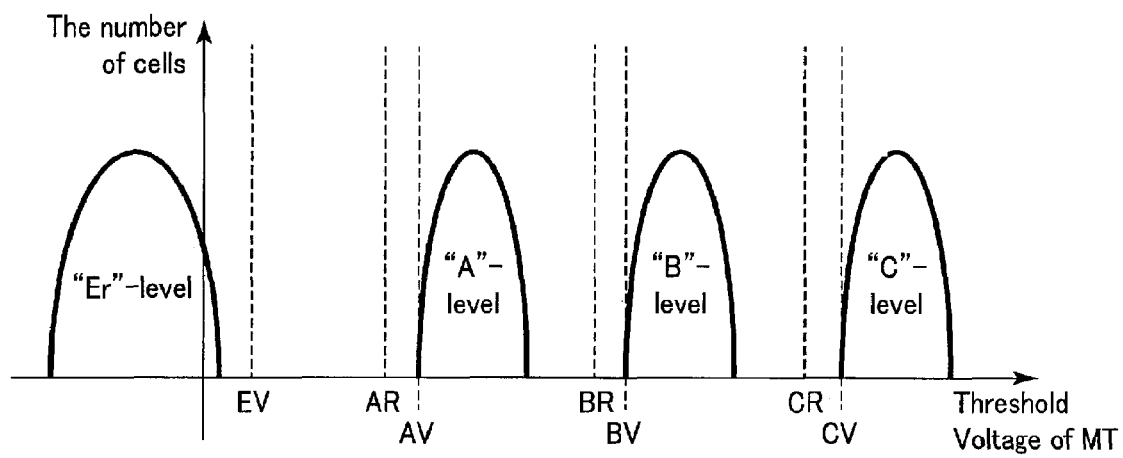
F I G. 4
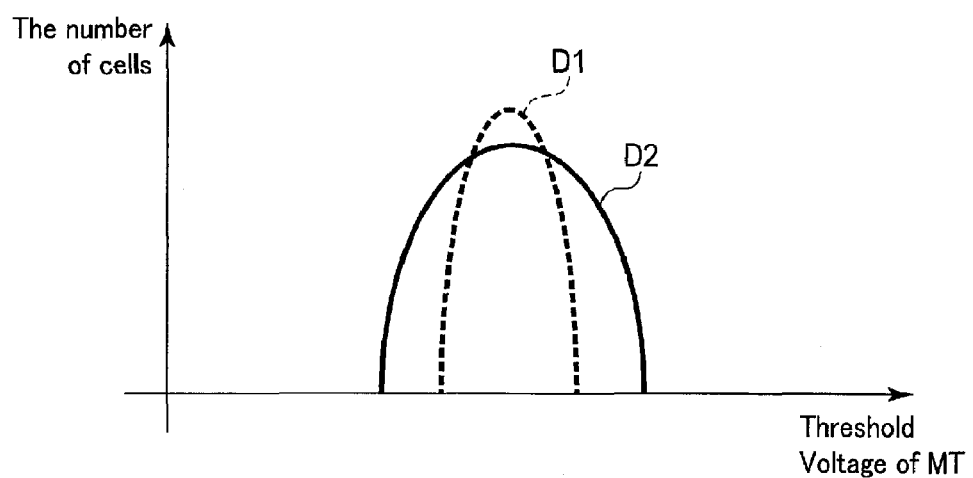
F I G. 5

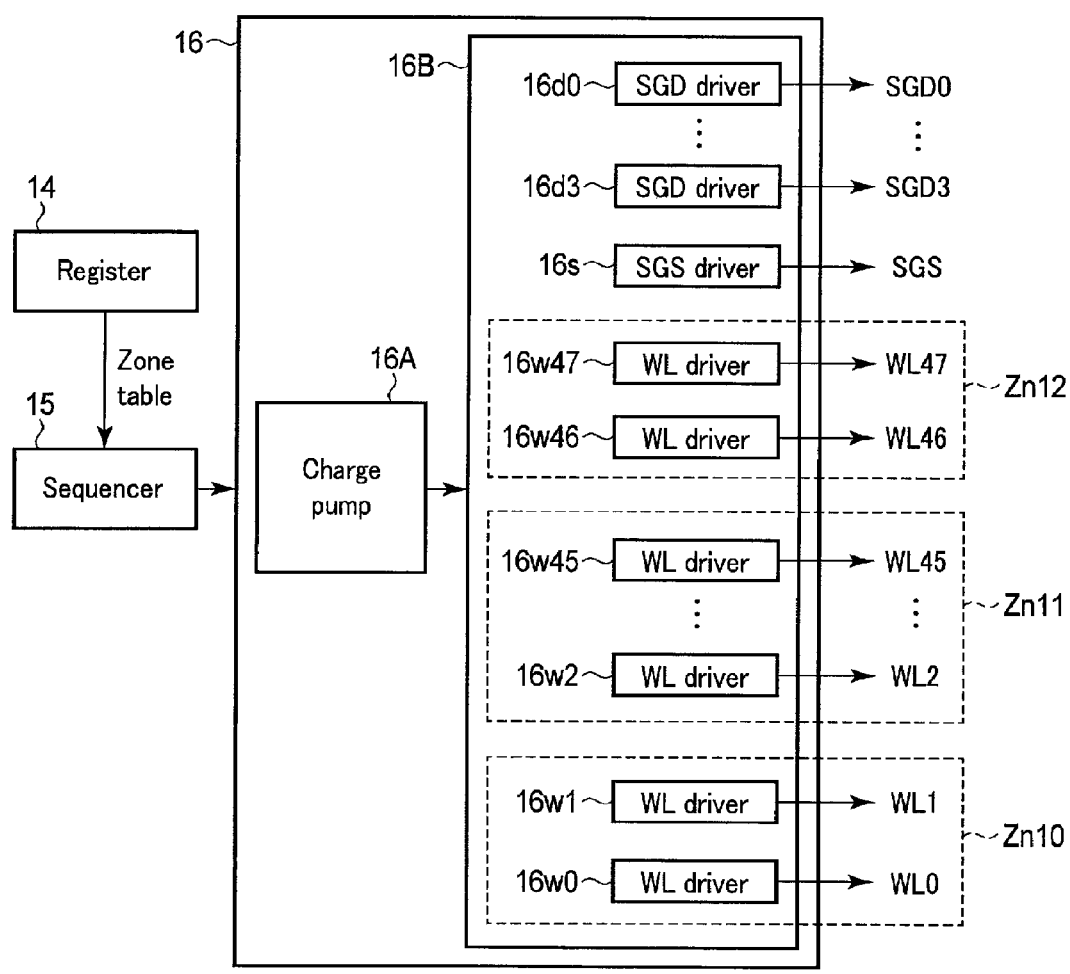
F I G. 6

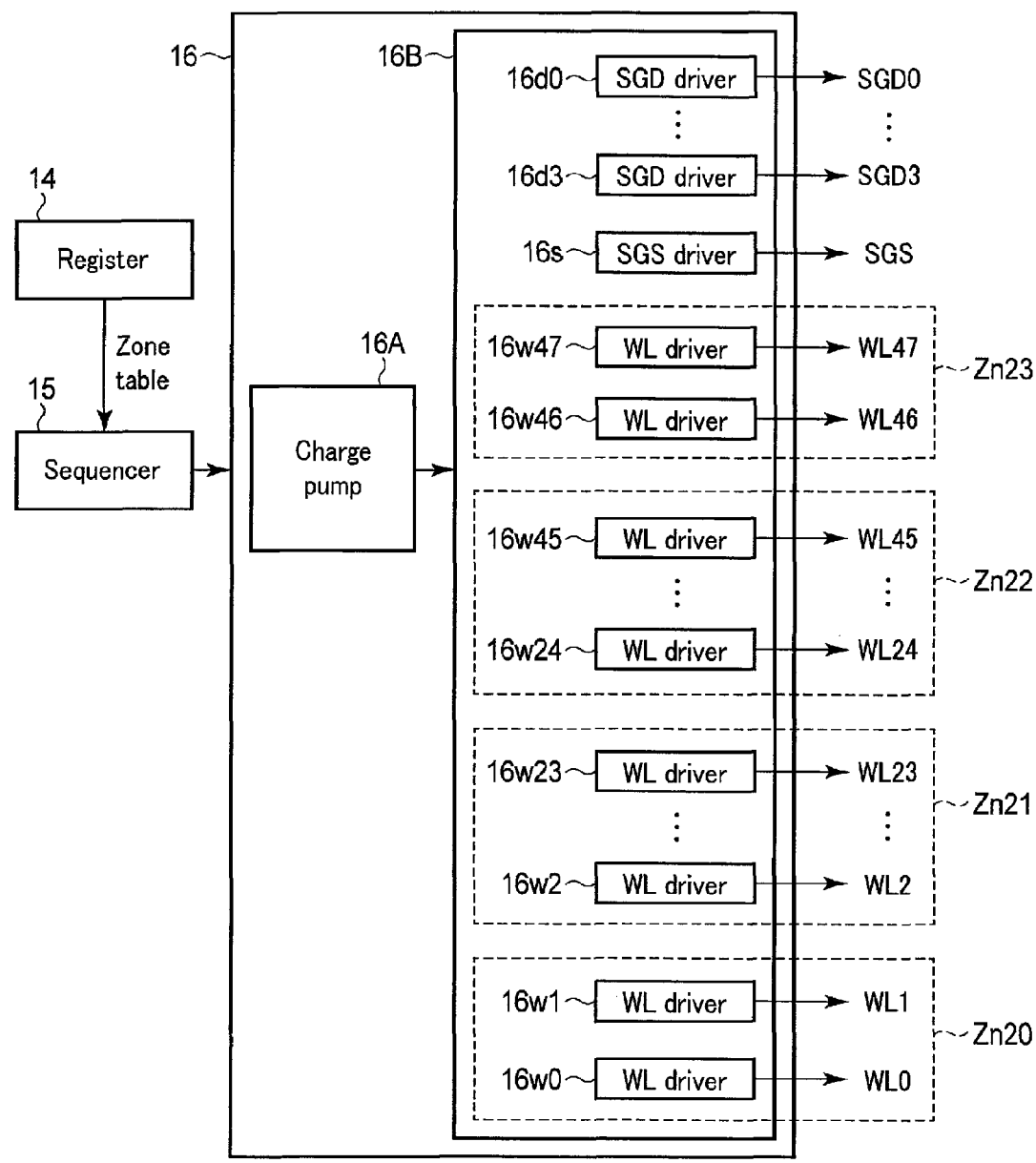
F I G. 12

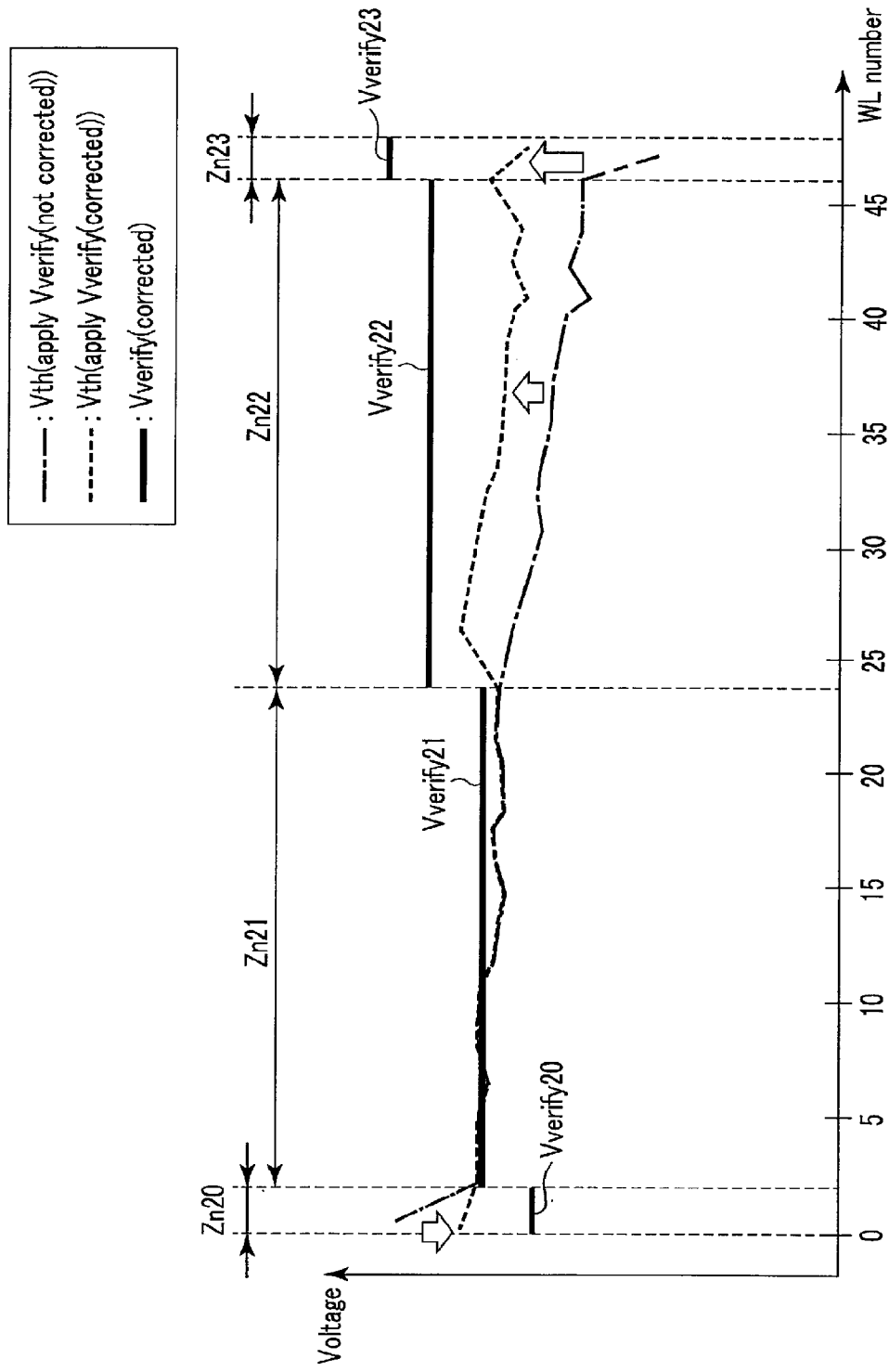
F I G. 15

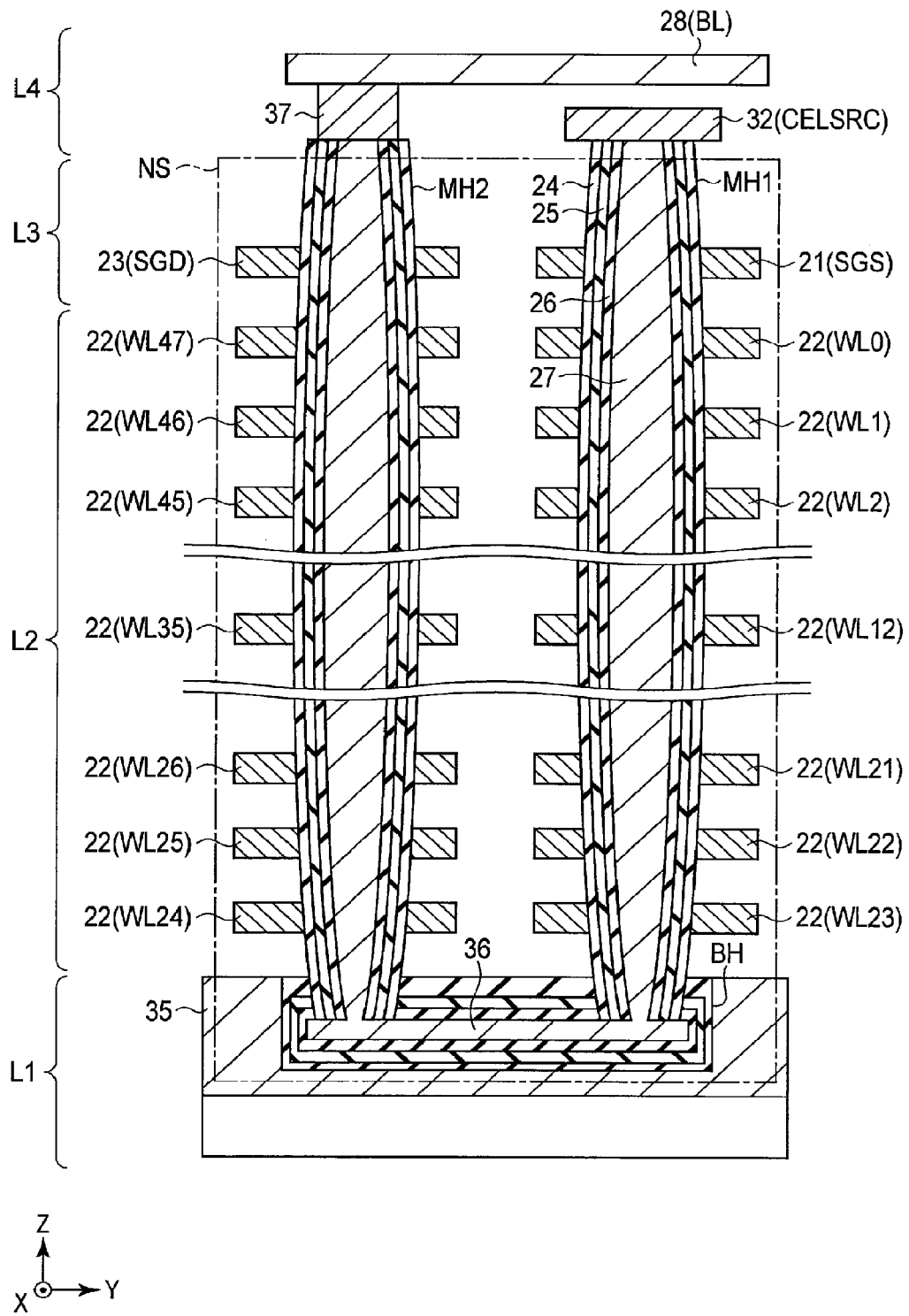
F I G. 16

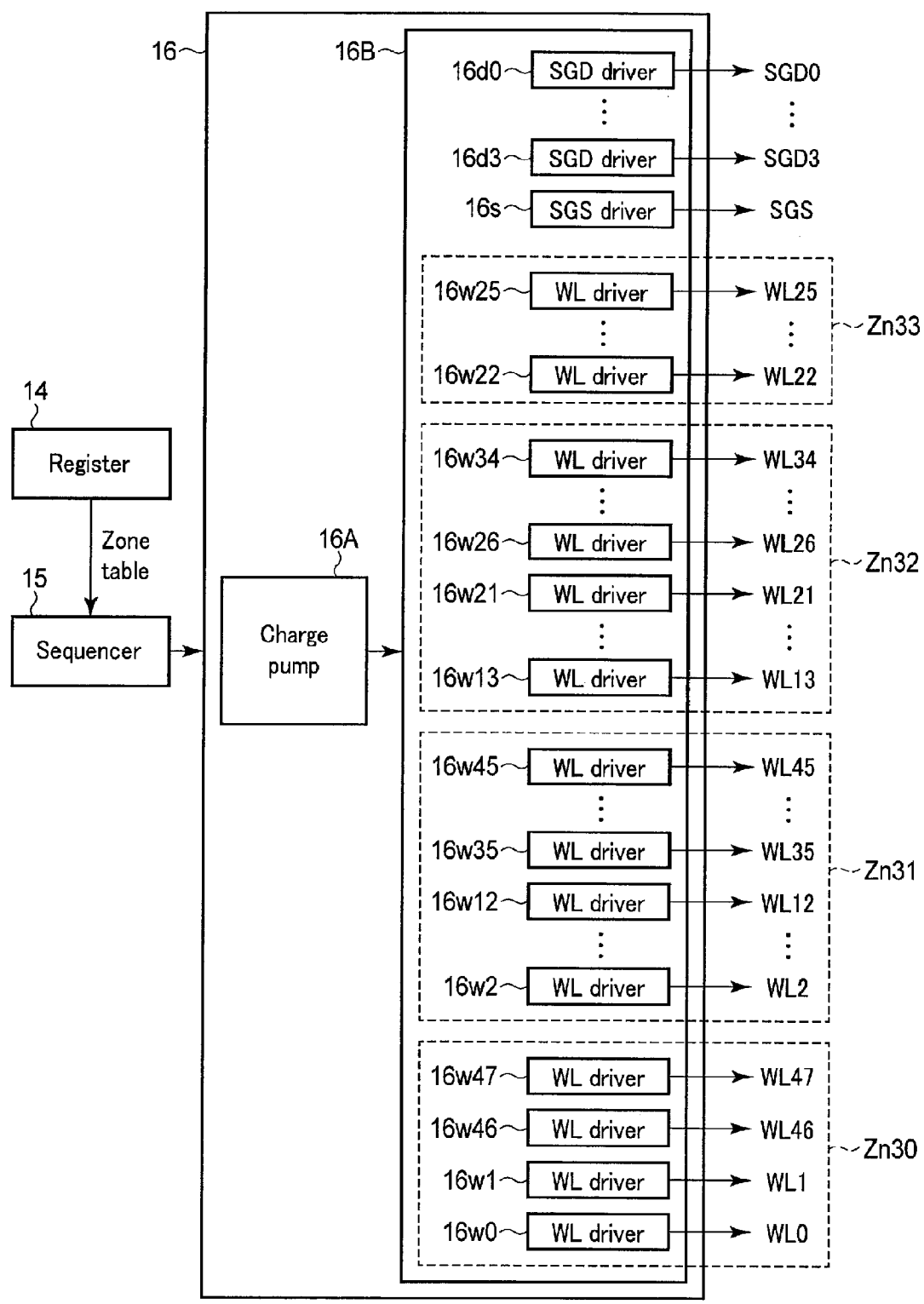
F I G. 17

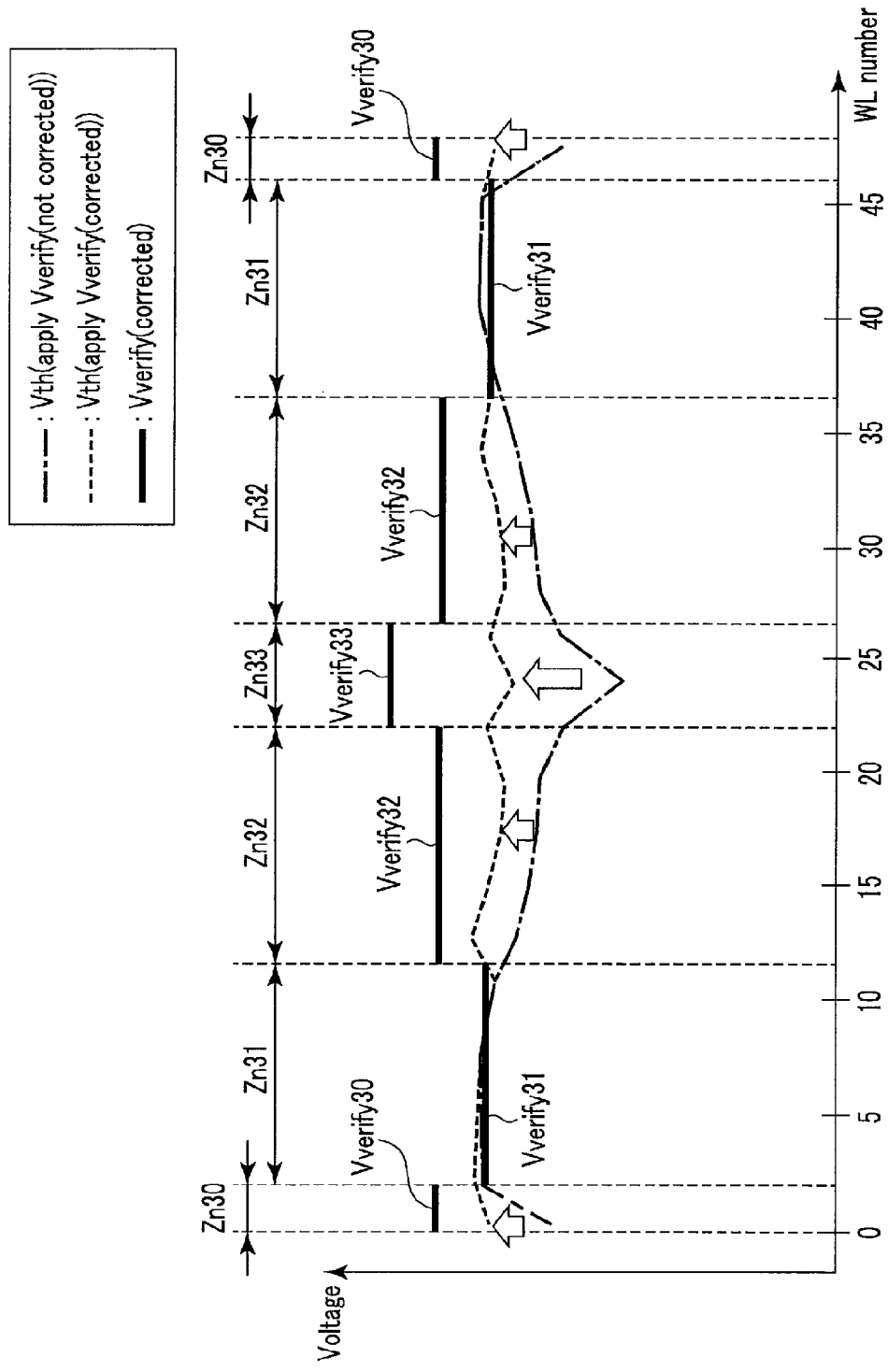
F I G. 20

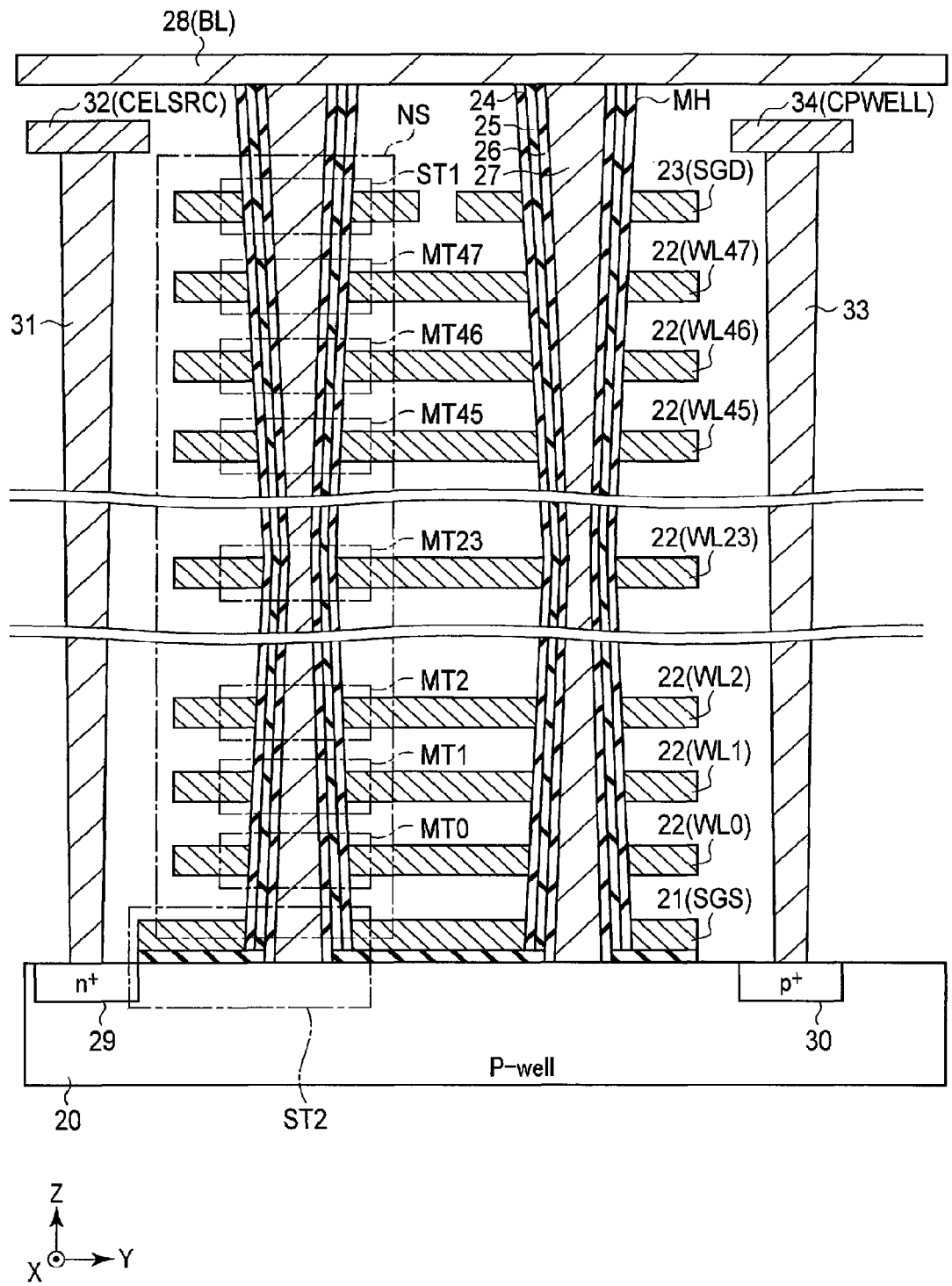
F I G. 21

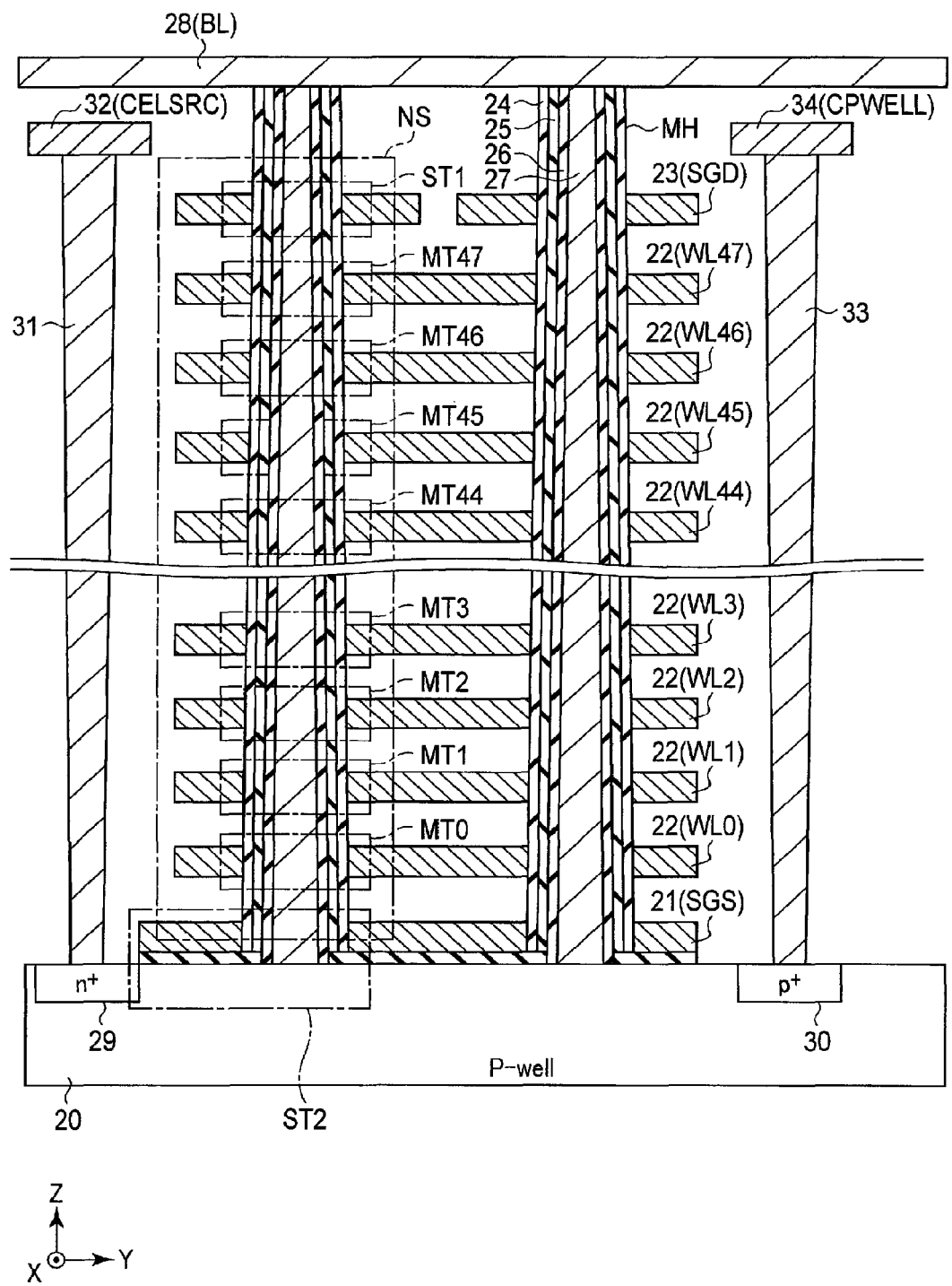
F I G. 23

SEMICONDUCTOR STORAGE DEVICE

CROSS-REFERENCE TO RELATED APPLICATIONS

This application is based upon and claims the benefit of priority from Japanese Patent Application No. 2016-051123, filed Mar. 15, 2016, the entire contents of which are incorporated herein by reference.

FIELD

Embodiments described herein relate generally to a semiconductor storage device.

BACKGROUND

As a semiconductor device, there is known a NAND flash memory in which memory cells are three-dimensionally stacked.

BRIEF DESCRIPTION OF THE DRAWINGS

FIG. 1 is a block diagram showing the configuration of a semiconductor storage device according to a first embodiment;

FIG. 2 is a circuit diagram showing the configuration of the memory cell array of the semiconductor storage device according to the first embodiment;

FIG. 4 is a diagram showing the threshold voltage distributions of the semiconductor storage device according to the first embodiment;

FIG. 5 is a diagram showing a variation in the threshold voltage distribution of the semiconductor storage device according to the first embodiment;

FIG. 6 is a block diagram showing the configuration of the voltage generator of the semiconductor storage device according to the first embodiment;

FIG. 12 is a block diagram showing the configuration of the voltage generator of the semiconductor storage device according to the second embodiment;

FIG. 15 is a diagram showing a threshold voltage distribution for the respective word lines after the verify voltage of the semiconductor storage device is corrected according to the second embodiment;

FIG. 16 is a sectional view showing part of the configuration of the memory cell array of a semiconductor storage device according to a third embodiment;

FIG. 17 is a block diagram showing the configuration of the voltage generator of the semiconductor storage device according to the third embodiment;

FIG. 20 is a diagram showing a threshold voltage distribution for the respective word lines after the verify voltage of the semiconductor storage device is corrected according to the third embodiment;

FIG. 21 is a sectional view showing part of the configuration of the memory cell array of a semiconductor storage device according to a first modification;

FIG. 23 is a sectional view showing part of the configuration of the memory cell array of a semiconductor storage device according to a second modification.

DETAILED DESCRIPTION

Figure 3:
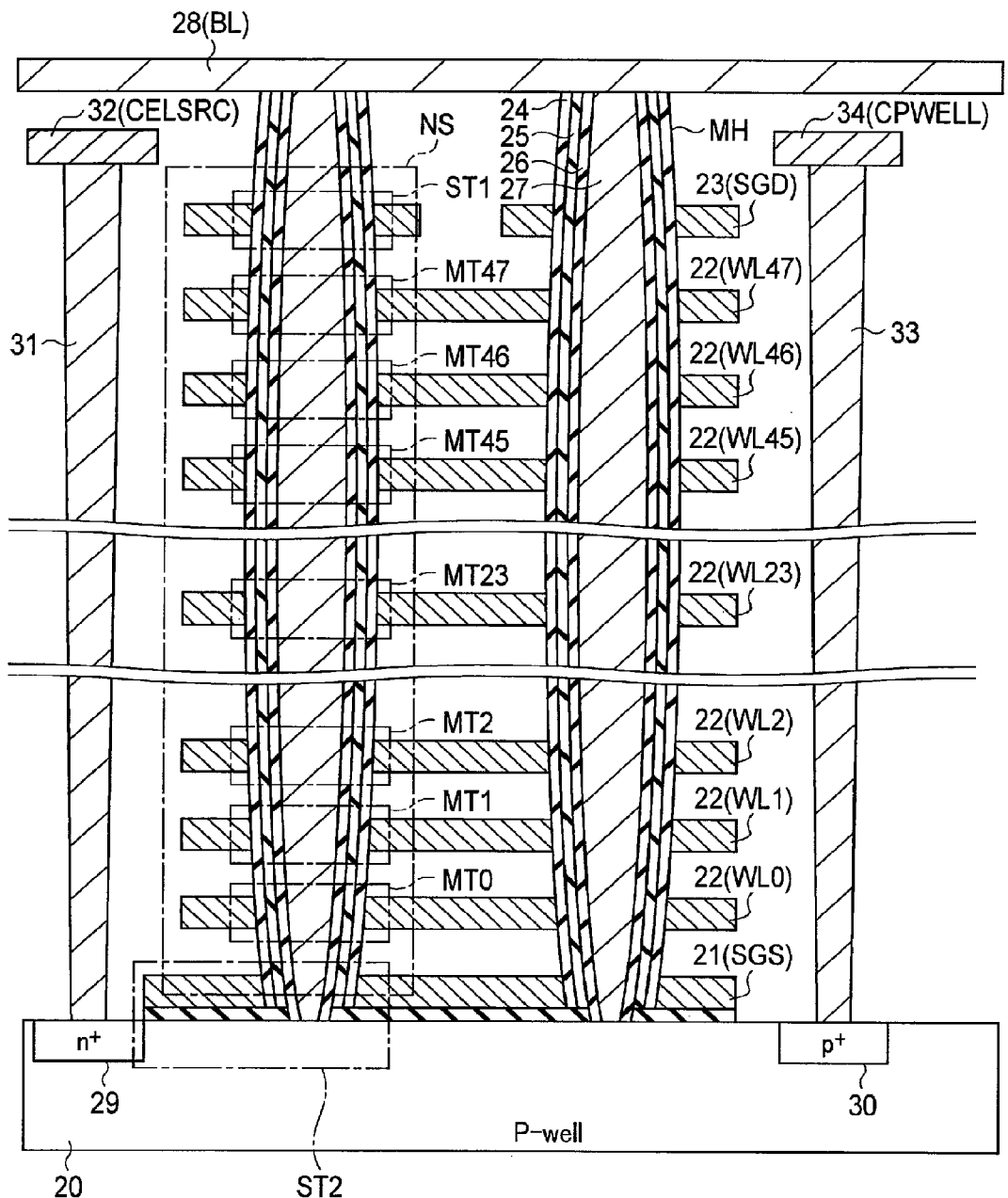
FIG. 3 is a cross-sectional view showing part of the configuration of the memory cell array of the semiconductor storage device according to the first embodiment.

In general, according to one embodiment, a semiconductor storage device includes a NAND string with a first set of memory cell transistors including a first memory cell transistor and a second set of memory cell transistors including a second memory cell transistor disposed above the first memory cell transistor. The number of memory cell transistors included in the first set is different from that of memory cell transistors included in the second set. During a program verify operation when a data item of a level is written to a memory cell transistor of the first set and a memory cell transistor of the second set, a first verify voltage is applied to a gate of the memory cell transistor of the first set and a second verify voltage different from the first verify voltage is applied to a gate of the memory cell transistor of the second set.

Embodiments will be described below with reference to the accompanying drawings. Note that in the following description, common reference numerals denote components having the same functions and configurations. To discriminate between a plurality of components having a common reference numeral, subscripts are added to the common reference numeral. Note that if it is not necessary to specifically discriminate between the plurality of components, the common reference numeral without any subscripts denotes the plurality of components.

1. First Embodiment

A semiconductor storage device according to a first embodiment will be described.

1.1 Configuration

1.1.1 Configuration of Semiconductor Storage Device

An example of the configuration of a semiconductor storage device according to the first embodiment will be described with reference to FIG. 1. FIG. 1 is a block diagram showing an example of the configuration of the semiconductor storage device according to the first embodiment.

A semiconductor storage device 1 includes a memory cell array 10, an input/output (I/O) circuit 11, a logic controller 12, a ready/busy controller (RY/BY) 13, a register 14, a sequencer 15, a voltage generator 16, a row decoder 17, and a sense amplifier 18.

The memory cell array 10 includes a plurality of blocks BLK (BLK0, BLK1, . . . ) Each block BLK is a set of a plurality of nonvolatile memory cell transistors (not shown) associated with word lines and bit lines. The block BLK is, for example, a data erase unit, and data in the same block BLK are erased simultaneously. Each block BLK includes a plurality of string units SU (SU0, SU1, SU2, . . . ). Each string unit SU is a set of NAND strings NS. Each NAND string NS includes a plurality of memory cell transistors. Note that the number of blocks in the memory cell array 10, the number of string units in one block BLK, and the number of NAND strings in one string unit SU can be set to arbitrary numbers.

The input/output circuit 11 transmits/receives signals I/O (I/O1 to I/O8) to/from the outside of the semiconductor storage device 1. The signals I/O are data entities, and include a command, an address, and write data or read data. The input/output circuit 11 transfers the command and address to the register 14. The input/output circuit 11 transmits/receives the write data and read data to/from the sense amplifier 18.

The logic controller 12 receives signals /CE, CLE, ALE, /WE, /RE, and /WP from the outside of the semiconductor storage device 1. The signal /CE is a signal for enabling the semiconductor storage device 1. The signals CLE and ALE notify the semiconductor storage device 1 that the signals I/O flowing to the semiconductor storage device 1 in parallel with the signals CLE and ALE are the command and address, respectively. The signal /WE instructs the semiconductor storage device 1 to receive the signal I/O flowing to the semiconductor storage device 1 in parallel with the signal /WE. The signal /RE instructs the semiconductor storage device 1 to output the signal I/O. The signal /WP instructs the semiconductor storage device 1 to prohibit data write and erasing.

The ready/busy controller 13 transfers a signal /RB to the outside of the semiconductor storage device 1 to notify the outside of the state of the semiconductor storage device 1. The signal /RB indicates that the semiconductor storage device 1 is in a ready state (a state for externally accepting an instruction) or a busy state (a state for externally accepting no instruction).

The register 14 holds the command and address. The register 14 transfers the address to the row decoder 17 and the sense amplifier 18, and transfers the command to the sequencer 15. The register 14 holds various tables for controlling a sequence executed based on the command.

The sequencer 15 receives the command, and refers to the various tables, thereby controlling the overall semiconductor storage device 1 in accordance with the sequence based on the command and information indicated in the various tables.

The voltage generator 16 generates a voltage necessary for an operation such as a data write operation, a read operation, and an erase operation based on an instruction from the sequencer 15. The voltage generator 16 supplies the generated voltage to the row decoder 17 and the sense amplifier 18.

The row decoder 17 receives the row address of the address from the register 14, and selects the block BLK based on the row address. The voltage from the voltage generator 16 is transferred to the selected block BLK.

At the time of data read, the sense amplifier 18 senses data read from the memory cell transistor to the bit line, and transfers the sensed read data to the input/output circuit 11. At the time of data write, the sense amplifier 18 transfers, to the memory cell transistor, write data written via the bit line. Furthermore, the sense amplifier 18 receives the column address of the address from the register 14, and outputs data of a column based on the column address.

1.1.2 Configuration of Memory Cell Array

The configuration of the memory cell array 10 of the semiconductor storage device according to the first embodiment will be described with reference to FIG. 2. FIG. 2 shows an example of a circuit diagram for explaining the configuration of the memory cell array 10 of the semiconductor storage device 1 according to the first embodiment.

As shown in FIG. 2, each of the NAND strings NS includes, for example, 48 memory cell transistors MT (MT0 to MT47) and select transistors ST1 and ST2. Note that the number of memory cell transistors MT is not limited to 48, and may be 8, 16, 32, 64, 128, or the like. The number of memory cell transistors is not specifically limited. Each memory cell transistor MT includes a stacked gate with a control gate and a charge accumulation layer. The respective memory cell transistors MT are serially connected between the select transistors ST1 and ST2. Note that in this specification and claims, "connection" includes connection via another conductive element.

In a given block BLK, the gates of the select transistors ST1 in the string units SU0 to SU3 are respectively connected to select gate lines SGD0 to SGD3. The gates of the select transistors ST2 in all the string units SU in the block BLK are commonly connected to a select gate line SGS. The control gates of the memory cell transistors MT0 to MT47 in the same block BLK are respectively connected to word lines WL0 to WL47. That is, the word lines WL of the same address are commonly connected to all the string units SU in the same block BLK, and the select gate line SGS is commonly connected to all the string units SU in the same block BLK. On the other hand, each select gate line SGD is connected to only one of the string units SU in the same block BLK.

In addition, the other-end sides of the select transistors ST1 of the NAND strings NS on the same row among the NAND strings NS arranged in a matrix in the memory cell array 10 are connected to one of n bit lines BL (BL0 to BL(n−1) (n is a natural number)). Each bit line BL is commonly connected to the NAND strings NS on the same column over the plurality of blocks BLK.

The other-end sides of the select transistors ST2 are connected to a source line CELSRC. The source line CELSRC is commonly connected to the plurality of NAND strings NS over the plurality of blocks BLK.

As described above, data are erased simultaneously for, for example, the memory cell transistors MT in the same block BLK. On the other hand, data read and write are performed simultaneously for a plurality of memory cell transistors MT commonly connected to one word line WL in one string unit SU in one block BLK. The unit of writing data simultaneously is called "page".

The sectional structure of the memory cell array 10 will be described with reference to FIG. 3. FIG. 3 shows an example of the sectional structure of part of the memory cell array of the semiconductor storage device according to the first embodiment. Particularly, FIG. 3 shows a portion associated with two string units SUs in one block BLK. More specifically, FIG. 3 shows two NAND strings NS in each of two string units SU and their peripheral portions. A plurality of configurations shown in FIG. 3 are arrayed in the X direction, and a set of a plurality of NAND strings NS arranged in the X direction corresponds to one string unit SU.

The semiconductor storage device 1 is provided on a semiconductor substrate (not shown). In the following description, a plane parallel to the upper surface of the semiconductor substrate is set as an X-Y plane, and a direction perpendicular to the X-Y plane is set as a Z direction. Assume that the X and Y directions are orthogonal to each other.

A p-type well region 20 is provided within the upper surface of the semiconductor substrate. A plurality of NAND strings NS are provided on the p-type well region 20. That is, on the p-type well region 20, for example, an interconnection layer 21 functioning as the select gate line SGS, 48 interconnection layers 22(WL0) to 22(WL47) respectively functioning as word lines WL0 to WL47, and an interconnection layer 23 functioning as the select gate line SGD are sequentially stacked. A plurality of interconnection layers 21 and a plurality of interconnection layers 23 may be stacked. Insulating films (not shown) are provided between the stacked interconnection layers 21 to 23.

The interconnection layer 21 is commonly connected to the gates of the select transistors ST2 of the plurality of NAND strings NS in one block BLK. Each of the interconnection layers 22 is commonly connected to the control gates of the memory cell transistors MT of the plurality of NAND strings NS in one block BLK. The interconnection layer 23 is commonly connected to the gates of the select transistors ST1 of the plurality of NAND strings NS in one string unit SU.

Memory holes MH are formed to reach the p-type well region 20 through the interconnection layers 23, 22, and 21. A block insulating film 24, a charge accumulation layer 25, and a tunnel oxide film 26 are sequentially provided on the side surface of each memory hole MH. A semiconductor pillar 27 is buried in each memory hole MH. The charge accumulation layer 25 may be an insulating film capable of accumulating charges or a conductive floating gate. The semiconductor pillar 27 is made of, for example, an undoped polysilicon, and functions as the current path of the NAND string NS. An interconnection layer 28 functioning as the bit lines BL is provided on the upper ends of the semiconductor pillars 27.

As described above, the select transistor ST2, the plurality of memory cell transistors MT, and the select transistor ST1 are sequentially stacked on the p-type well region 20, and one memory hole MH corresponds to one NAND string NS.

An $n^+$-type impurity diffusion region 29 and a $p^+$-type impurity diffusion region 30 are formed within the surface of the p-type well region 20. A contact 31 is provided on the upper surface of the $n^+$-type impurity diffusion region 29. An interconnection layer 32 functioning as the source line CELSRC is provided on the upper surface of the contact 31. A contact 33 is provided on the upper surface of the $p^+$-type impurity diffusion region 30. An interconnection layer 34 functioning as a well line CPWELL is provided on the upper surface of the contact 33.

Note that the plurality of memory holes MH have, for example, the same shape. The shape of the memory holes MH can be nonuniformly formed over a plurality of different positions in the Z direction mainly based on a manufacturing step. For example, the memory holes MH have a bow shape. More specifically, the diameter of each memory hole MH is largest in a layer (for example, the interconnection layer 22(WL23)) near the center of the interconnection layers 22, and decreases toward the end portions in the Z direction. For example, the change rate of the diameter of each memory hole MH is low near the center, and increases toward the end portions. The magnitude of the diameter of each memory hole MH differs along the Z direction. In other words, the diameter of the memory hole MH has word line WL-dependence.

The diameter of each memory hole MH can influence the threshold voltage characteristics of the memory cell transistors MT. That is, the threshold voltage characteristics of the memory cell transistors MT can have word line WL-dependence. Especially, the threshold voltage characteristics of the memory cell transistors MT can largely change in the interconnection layers (for example, near the interconnection layers 22(WL0) and 22(WL47)) in which the change rate of the diameter of the memory hole MH is high.

The threshold voltage characteristic of the memory cell transistor MT includes, for example, a degree at which charges are accumulated in the charge accumulation layer 25 at the time of data write. The threshold voltage of the memory cell transistor MT tends to rise as the diameter of the memory hole MH decreases. However, the threshold voltage characteristic is not limited to this, and is determined when various characteristics interact with each other. Therefore, the threshold voltage characteristic is not uniquely determined based on only the diameter of the memory hole MH. As another example, for example, the threshold voltage characteristic includes a degree to which charges are unintentionally accumulated at the time of writing data to the adjacent memory cell transistor MT, and a degree to which accumulated charges flow out from data write to data read. In addition, for example, the threshold voltage characteristic includes an element which changes the threshold voltage after data write before data read, like a parasitic resistance generated in another memory cell transistor MT.

Note that the memory cell array 10 may have another configuration. The configuration of the memory cell array 10 is described in, for example, U.S. patent application Ser. No. 12/407,403 "three dimensional stacked nonvolatile semiconductor memory" filed Mar. 19, 2009. The configuration is also described in U.S. patent application Ser. No. 12/406,524 "three dimensional stacked nonvolatile semiconductor memory" filed Mar. 18, 2009, U.S. patent application Ser. No. 12/679,991 "non-volatile semiconductor storage device and method of manufacturing the same" filed Mar. 25, 2010, and U.S. patent application Ser. No. 12/532,030 "semiconductor memory and method for manufacturing same" filed Mar. 23, 2009. The entire contents of the patent applications are incorporated by reference in this specification.

1.1.3 Threshold Voltage Distributions of Memory Cell Transistors

The threshold voltage distributions of the memory cell transistors of the semiconductor storage device according to the first embodiment will be described next. FIG. 4 is a diagram showing examples of the threshold voltage distributions of the memory cell transistors of the semiconductor storage device according to the first embodiment.

As shown in FIG. 4, each memory cell transistor MT can hold, for example, 2-bit data in accordance with the threshold voltage. The 2-bit data are held by classifying the memory cell transistors MT into, for example, "Er"-level, "A"-level, "B"-level, and "C"-level in ascending order of threshold voltage.

"Er"-level is a threshold voltage distribution in a state in which data is erased, and has, for example, a negative value (or may have a positive value) which is lower than an erase verify level (to also be referred to as a verify level, a verify voltage, or the like hereinafter) EV. "A"- to "C"-levels are threshold voltage distributions in a state in which charges are injected into the charge accumulation layer 25.

The memory cell transistor MT having a distribution of voltages higher than a verify level "AV" is classified into "A"- or higher-level. "A"-level indicates a threshold voltage higher than a read level "AR" and lower than a read level "BR".

The memory cell transistor MT having a distribution of voltages higher than a verify level "BV" is classified into "B"- or higher-level. "B"-level indicates a threshold voltage higher than the read level "BR" and lower than a read level "CR".

The memory cell transistor MT having a distribution of voltages higher than a verify level "CV" is classified into "C"- or higher-level. "C"-level indicates a threshold voltage higher than the read level "CR". In this way, each memory cell transistor MT can store 2-bit data (4-level data) by taking threshold voltages of four levels.

The threshold voltage of the memory cell transistor MT at each of "Er"- to "C"-levels varies after data write, and is finally distributed within a given range. FIG. 5 is a diagram showing an example of a variation in the threshold voltage distribution of the semiconductor storage device according to the first embodiment. As shown in FIG. 5, the threshold voltage distribution at a given level can vary from a distribution D1 to a distribution D2 with time. The distribution D1 is a threshold distribution obtained immediately after data write at a given level. The distribution D2 is a threshold distribution obtained at the time of data read at the level at which the distribution D1 has been obtained.

Such variation in the distribution can occur due to various factors from data write to data read. For example, the threshold voltage can rise when charges are newly accumulated at the time of data write to the peripheral memory cell transistor MT. Furthermore, for example, the threshold voltage can lower when accumulated charges flow out before data read. For example, the parasitic resistance changes due to data write to the peripheral memory cell transistor MT, and the threshold voltage can accordingly rise or lower. As described above, the threshold voltages can be distributed within a wider range at the time of data read, as compared with data write. In the following description, a case in which the threshold voltage varies after data write before data read and is distributed within a wider range will be referred to as "a variation in a threshold voltage distribution" hereinafter.

As described above, the characteristic of the threshold voltage of the memory cell transistor MT can have word line WL-dependence. Thus, a variation in the threshold voltage distribution can have word line WL-dependence. Especially, a variation in the threshold voltage distribution can be larger in each of the word lines WL in the end portions of the NAND string NS.

1.1.4 Zones

Zones applied to the semiconductor storage device according to the first embodiment will be described next. FIG. 6 is a block diagram showing an example of the configuration of the voltage generator of the semiconductor storage device according to the first embodiment.

As shown in FIG. 6, the voltage generator 16 includes a charge pump 16A and a driver circuit 16B. The charge pump 16A generates a plurality of voltages necessary for a write operation, a read operation, an erase operation, and the like based on an instruction from the sequencer 15. The charge pump 16A transfers the plurality of generated voltages to the driver circuit 16B. The driver circuit 16B transfers, to various interconnections, the plurality of voltages supplied from the charge pump 16A based on an instruction from the sequencer 15.

More specifically, for example, the driver circuit 16B includes four SGD drivers 16d (16d0 to 16d3), an SGS driver 16s, and 48 word line drivers 16w (16w0 to 16w47). The SGD drivers 16d0 to 16d3 transfer the voltages to the select gate lines SGD0 to SGD3, respectively. The SGS driver 16s transfers the voltage to the select gate line SGS. The word line drivers 16w0 to 16w47 transfer the voltages to the word lines WL0 to WL47, respectively.

The word line drivers 16w are classified into a plurality of sets (zones) based on an instruction from the sequencer 15. Under the control of the sequencer 15, the word line driver 16w classified into a given zone transfers a verify voltage different from that for the word line driver 16w classified into another zone. More specifically, for example, the word line drivers 16w are classified into three zones Zn1 (Zn10 to Zn12) in a verify operation (to be referred to as a "program verify operation" hereinafter) of data write. That is, the word line drivers 16w0 and 16w1 are classified into the zone Zn10. The word line drivers 16w2 to 16w45 are classified into the zone Zn11. The word line drivers 16w46 and 16w47 are classified into the zone Zn12.

Based on a zone table for identifying zones, the sequencer 15 instructs, to the voltage generator 16, a voltage to be generated. For example, the zone table indicates, for each zone, the same or different value for one of various voltages used in the operation of the semiconductor storage device 1. The sequencer 15 causes the word line drivers 16w in a given zone Zn1 to transfer a voltage corresponding to the zone Zn1 using the zone table. The zone table is, for example, one of tables held in advance in the register 14. Note that the zone table is determined based on, for example, the tendency of the word line WL-dependence of a variation in the threshold voltage distribution of each memory cell transistor MT. The word line WL-dependence of a variation in the threshold voltage distribution is measured at the time of, for example, a pre-shipment test. The zone table may be determined for each wafer. The present invention, however, is not limited to this. The zone table may be dynamically determined within various ranges for, for example, each chip or each block BLK.

Figure 7:
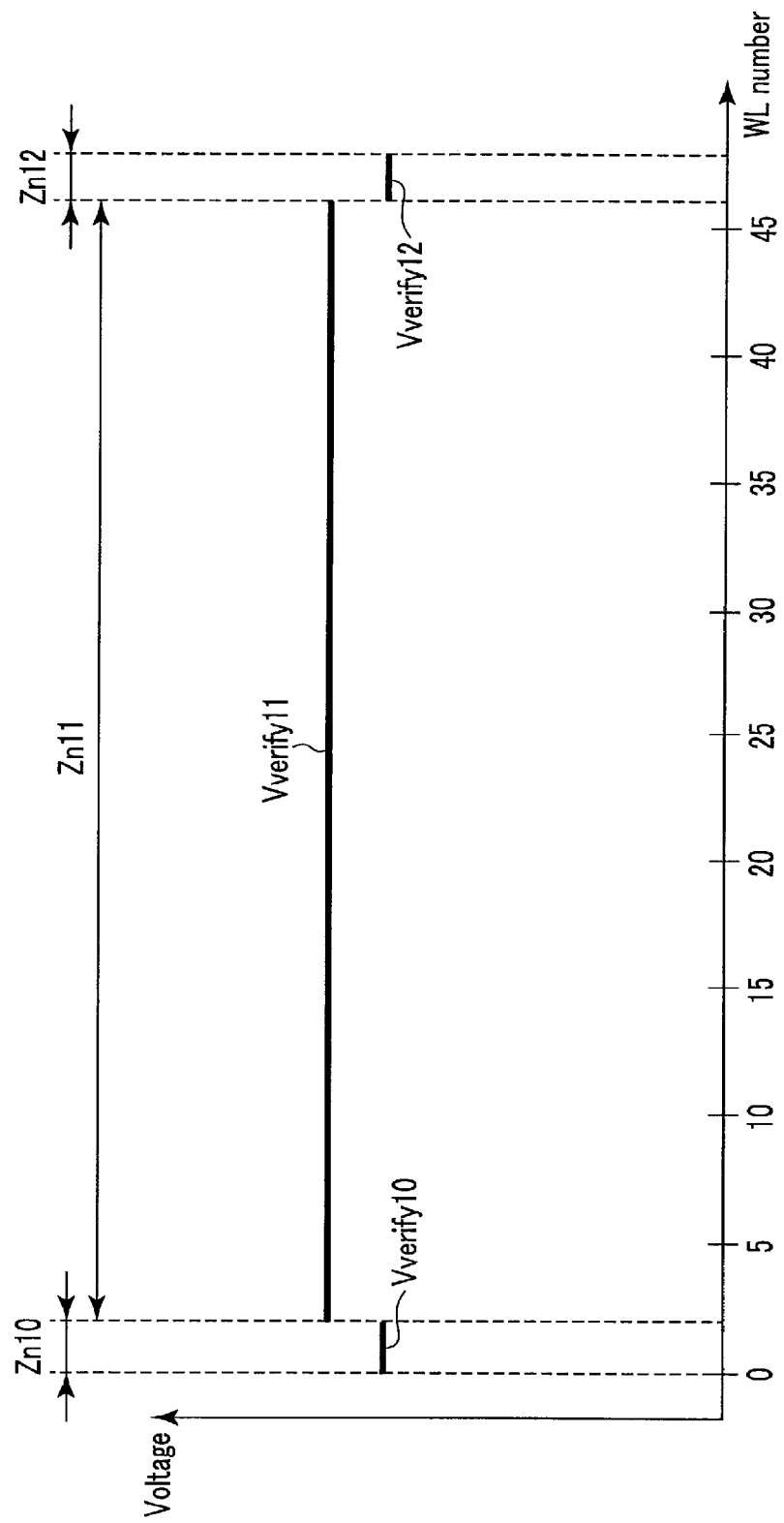
FIG. 7 is a diagram showing a zone table applied to the semiconductor storage device according to the first embodiment.

FIG. 7 is a diagram schematically showing contents of an example of the zone table applied at the time of a program verify operation at a given level of the semiconductor storage device according to the first embodiment. As shown in FIG. 7, at the time of a program verify operation associated with data of the same level, a verify voltage Vverify11 is applied to the word lines WL2 to WL45 corresponding to the zone Zn11. A verify voltage Vverify10 lower than the verify voltage Vverify11 is applied to the word lines WL0 and WL1 corresponding to the zone Zn10. A verify voltage Vverify12 lower than the verify voltage Vverify11 is applied to the word lines WL46 and WL47 corresponding to the zone Zn12.

1.2 Operation

Figure 8:
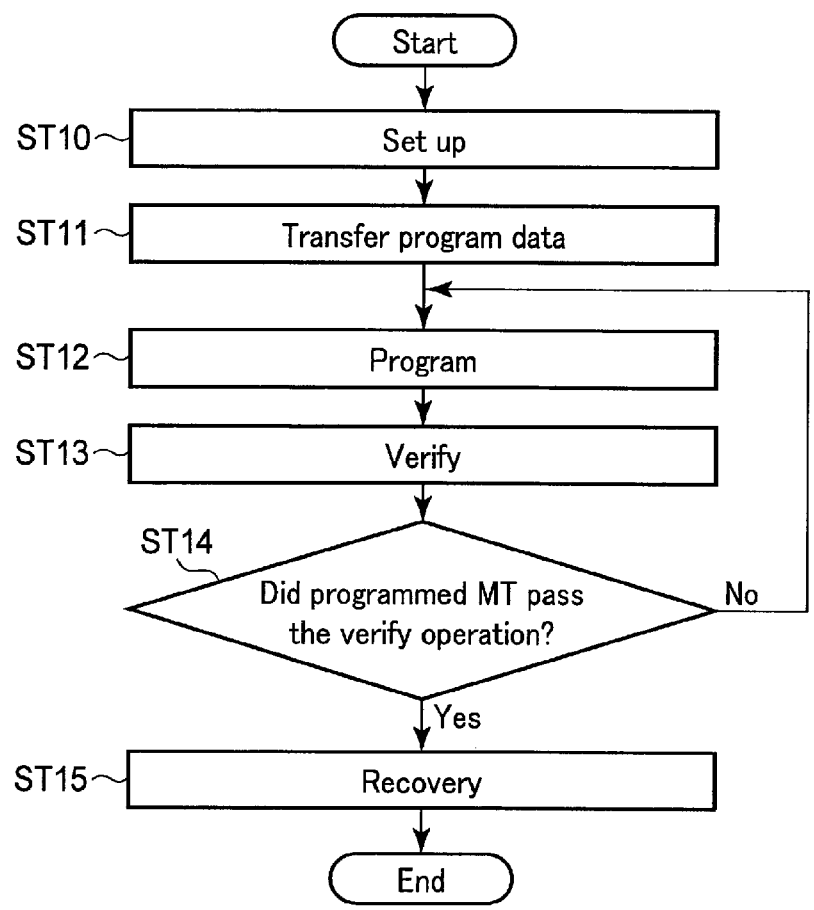
FIG. 8 is a flowchart illustrating the data write operation of the semiconductor storage device according to the first embodiment.

The data write operation of the semiconductor storage device according to the first embodiment will be described next. FIG. 8 is a flowchart illustrating an example of the data write operation of the semiconductor storage device according to the first embodiment. In the following description, if each of the block BLK, string unit SU, NAND string NS, and memory cell transistor MT is the target of a program operation or program verify operation, "selected" is added to each name. If each of the elements is not the target of the program operation or program verify operation, "unselected" is added to each name. Similarly, a word line WL connected to a selected memory cell transistor MT will be referred to as a selected word line WL hereinafter, and a word line WL connected to an unselected memory cell transistor MT will be referred to as an unselected word line WL hereinafter. Note that in the program verify operation, the zone table containing the contents of the diagram shown in FIG. 7 is applied.

As shown in FIG. 8, in step ST10, upon receiving a write command, the sequencer 15 performs a setup. That is, the sequencer 15 instructs the voltage generator 16 to start the circuit. In response to this, the voltage generator 16 generates a plurality of voltages including the verify voltages Vverify10, Vverify11, and Vverify12.

In step ST11, write data is transferred to the sense amplifier 18. The sense amplifier 18 charges each bit line BL in accordance with the write data.

In step ST12, the program operation is executed in accordance with the write data. The program operation is an operation of accumulating charges in the selected memory cell transistor MT by applying the voltage to the word line, and raising the threshold voltage. More specifically, the word line driver 16w applies a voltage Vpgm to the selected word line WL via the row decoder 17. Furthermore, the word line driver 16w applies a voltage Vpass to the unselected word lines WL. The voltage Vpgm is a voltage for injecting charges into the charge accumulation layer 25, and is higher than the voltage Vpass. The voltage Vpass is a voltage for setting the unselected memory cell transistors MT in an ON state, and has a magnitude for suppressing an erroneous write operation to the unselected memory cell transistors MT.

In step ST13, the program verify operation is executed. In the program verify operation, after the program operation in step ST12, data is read from the memory cell transistor MT. This causes the sequencer 15 to determine in step ST14 whether desired data has been written. More specifically, the word line drivers 16w apply the verify voltage to the selected word line WL, and apply a voltage Vread to the unselected word lines WL. The voltage Vread has a magnitude for turning on the unselected memory cell transistors MT regardless of the held data.

A verify voltage of a different value is applied in accordance with the selected word line WL based on the zone table. That is, if one of the word lines WL0 and WL1 is the selected word line WL, one of the word line drivers 16w0 and 16w1, which is connected to the selected word line WL, applies the verify voltage Vverify10 to the corresponding one of the word lines WL0 and WL1. If one of the word lines WL2 to WL45 is the selected word line WL, one of the word line drivers 16w2 to 16w45, which is connected to the selected word line WL, applies the verify voltage Vverify11 to the corresponding one of the word lines WL2 to WL45.

If one of the word lines WL46 and WL47 is the selected word line WL, one of the word line drivers 16w46 and 16w47, which is connected to the selected word line WL, applies the verify voltage Vverify12 to the corresponding one of the word lines WL46 and WL47.

In step ST14, the sequencer 15 executes determination. More specifically, if a rise in threshold voltage of the memory cell transistor MT is insufficient, the sequencer 15 determines that data write is incomplete (the program verify operation has failed) (NO in step ST14). In this case, the process returns to step ST12 to re-execute the program operation. On the other hand, if the threshold voltage of the memory cell transistor MT sufficiently rises by repeating the above program operation, the sequencer 15 determines that desired data has been written (the program verify operation has been passed) (YES in step ST14). In this case, the process advances to step ST15.

In step ST15, a recovery operation is performed, and the data write operation ends.

1.3 Effect of Embodiment

According to the first embodiment, it is possible to suppress a state in which the threshold voltages excessively vary at the time of data read. This effect will be described below.

It is known that the threshold voltage of the memory cell transistor varies from data write to data read. For example, the threshold voltage of a floating gate type memory cell transistor is influenced by a variation in the parasitic resistance from data write to data read. The magnitude of the variation in the parasitic resistance increases as the data write ordinal number in the same NAND string decreases. That is, the variation in the threshold voltage distribution is consistent with the write ordinal number in the NAN string. Therefore, in the related art, a set of memory cell transistors equally divided with respect to data write ordinal numbers in the NAND string is classified into zones. By setting a different verify voltage for each zone, an attempt is made to reduce the variation in the threshold voltage distribution.

Figure 9:
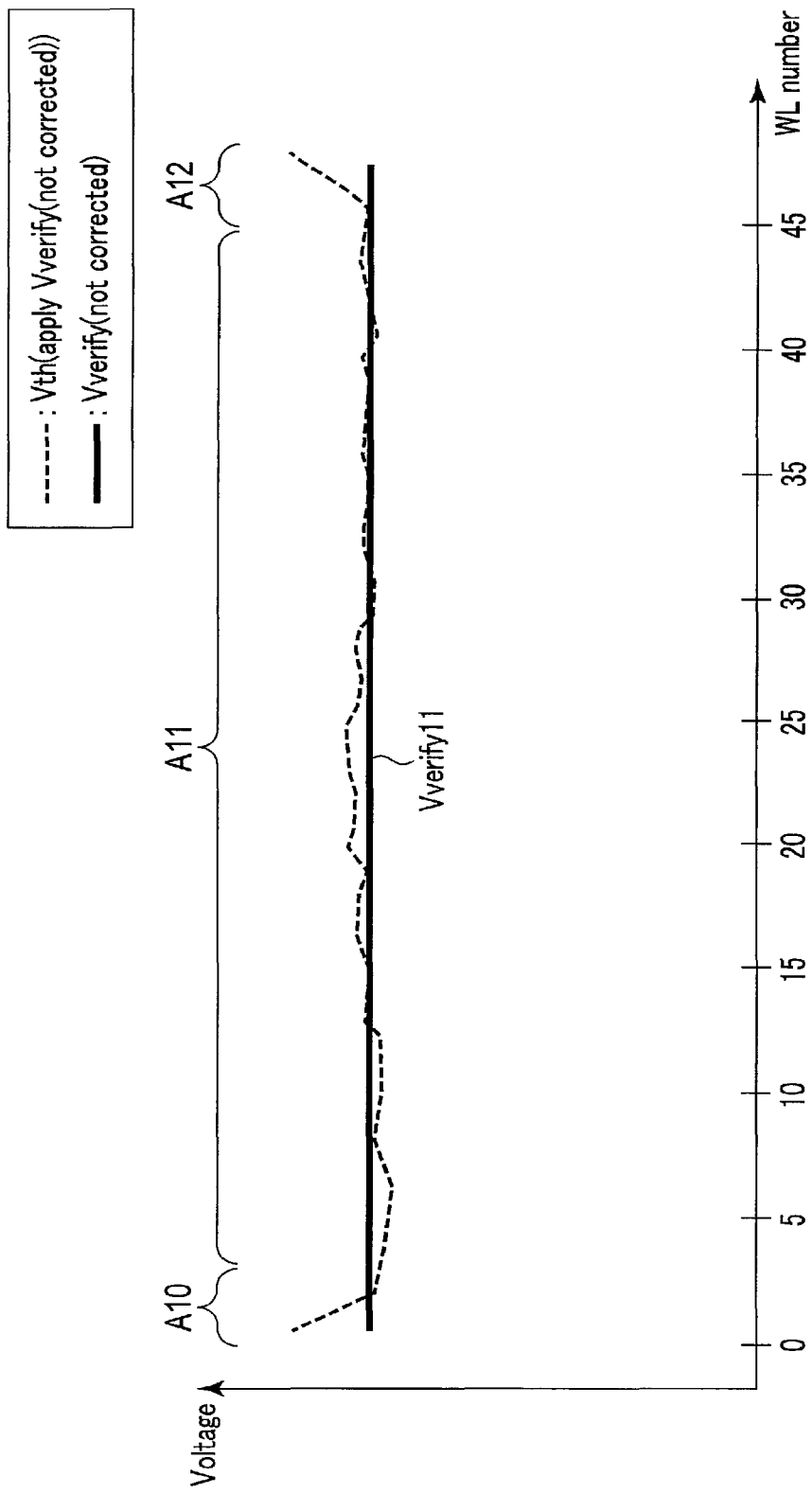
FIG. 9 is a diagram showing a threshold voltage distribution for respective word lines when the verify voltage of the semiconductor storage device is not corrected according to the first embodiment.

On the other hand, due to the form of the 3D-stacked nonvolatile semiconductor storage device, word line-dependence of the memory cell transistor occurs due to, for example, the manufacturing error of the memory hole. The shape of the memory cell transistor causes a variation in the threshold voltage distribution. The shape of the memory cell transistor may vary nonuniformly for each word line. The variation in the threshold voltage distribution may thus be nonuniform. Especially, the variation in the threshold voltage distribution becomes larger in the end portions of the NAND string. FIG. 9 is a diagram showing an example of the threshold voltage distribution for the respective word lines when the verify voltage of the semiconductor storage device 1 is not corrected according to the first embodiment. FIG. 9 shows the threshold voltages at the time of data read, which have been classified for the respective word lines, when data write is performed to all the memory cell transistors MT of the semiconductor storage device 1 using the same verify voltage Vverify11. As shown in FIG. 9, the NAND string NS is divided into end regions A10 and A12 and a central region A11. The number of memory cell transistors MT included in the end region A10 or A12 is different from the number of memory cell transistors MT included in the central region A11, and is, for example, smaller. If the same verify voltage Vverify11 is used, the variation in the threshold voltage distribution is larger in the end regions A10 and A12 of the NAND string NS than in the central region A11. More specifically, in the example of FIG. 9, the threshold voltages (the threshold voltages in the central region A11) of the memory cell transistors MT in the central region A11 at the time of data read are distributed around the verify voltage Vverify11. On the other hand, the threshold voltages in the end regions A10 and A12 largely increase with respect to the verify voltage Vverify11 from data write to data read due to the characteristics of the memory cell transistors MT in the end regions A10 and A12. Thus, there is room to study correction of the variation in the threshold voltage distribution, which occurs in the end portions of the NAND string at the time of data read.

In the configuration according to the first embodiment, a verify voltage of a value for each zone is used at the time of the program verify operation when data of the same level are written. For example, the verify voltages are applied to the end regions A10 and A12 and the central region A11 based on the zone table for defining the different zones Zn10 to Zn12. More specifically, a verify voltage different from that for the control gates of the memory cell transistors MT included in the zone Zn11 is applied to the control gates of the memory cell transistors MT included in the zone Zn10 and Zn12. This can correct the variation in the threshold voltage distribution, which occurs in the end portions of the NAND string NS at the time of data read.

Figure 10:
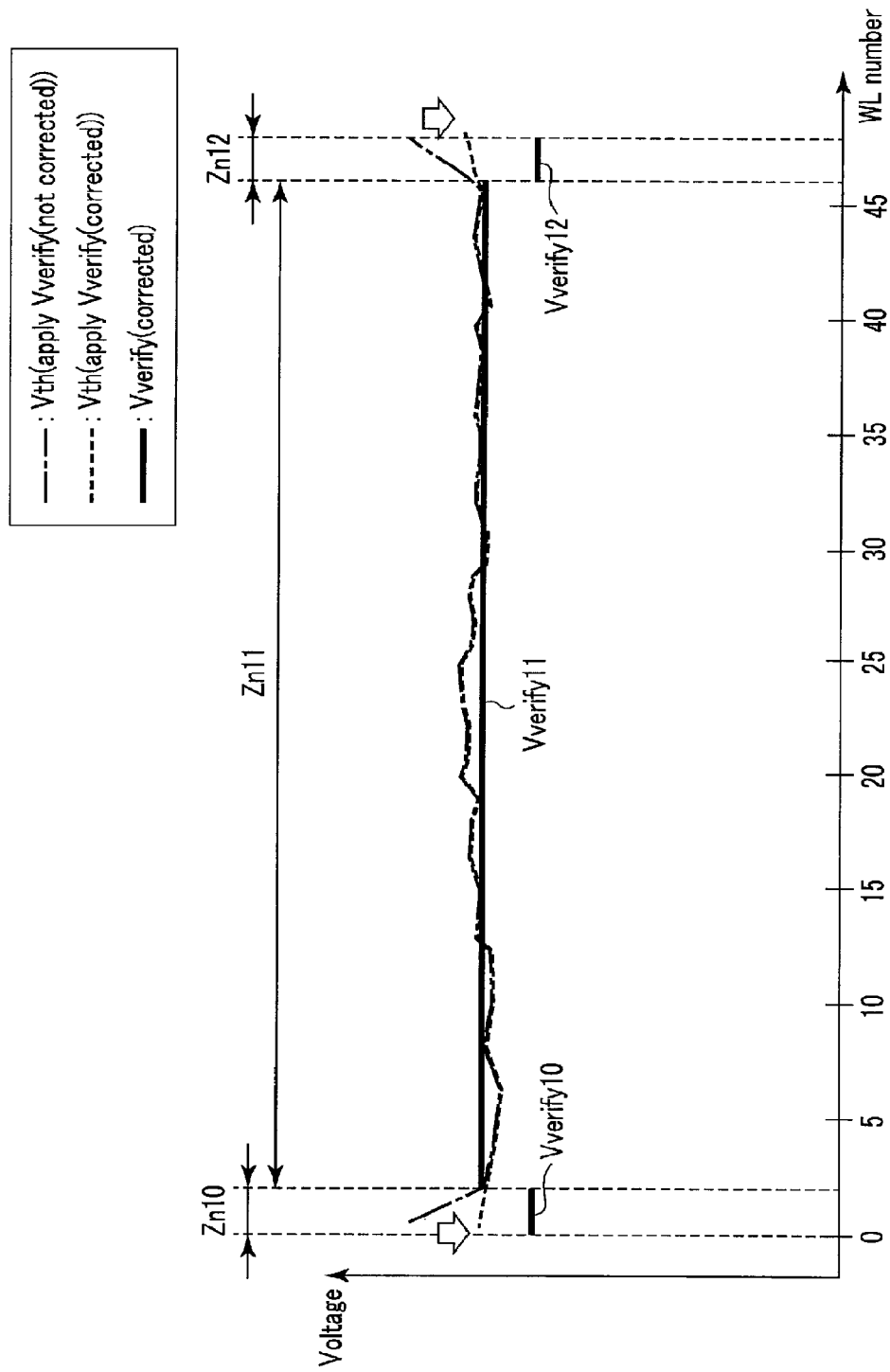
FIG. 10 is a diagram showing a threshold voltage distribution for the respective word lines after the verify voltage of the semiconductor storage device is corrected according to the first embodiment.

FIG. 10 is a diagram showing an example of the threshold voltage distribution for the respective word lines after the verify voltage of the semiconductor storage device 1 is corrected according to the first embodiment. FIG. 10 shows a variation in the threshold voltage distribution for the respective word lines when the verify voltages Vverify10 to Vverify12 are applied to the zones Zn10 to Zn12, respectively. As shown in FIG. 10, the verify voltages Vverify10 and Vverify12 are lower than the verify voltage Vverify11. Thus, the memory cell transistors MT in the zones Zn10 and Z12 pass the program verify operation in a state in which less charges are accumulated, as compared with a case in which the verify voltage Vverify11 is set. After that, the threshold voltages of the memory cell transistors MT in the zones Zn10 and Zn12 rise due to the characteristics of the memory cell transistors MT. As a result, the threshold voltages of the zones Zn10 and Zn12 are distributed around the verify voltage Vverify11. That is, the threshold voltages of all the memory cell transistors MT are corrected so that they do not depend on the word lines WL at the time of data read. Therefore, it is possible to suppress a state in which the threshold voltages excessively vary in the end portions of the NAND string at the time of data read.

2. Second Embodiment

A semiconductor storage device according to the second embodiment will be described next. The semiconductor storage device according to the second embodiment suppresses a state in which threshold voltages excessively vary at the time of data read not only when only threshold voltages in end portions largely vary, as described with reference to FIG. 9, but also when it is necessary to correct a variation in a threshold voltage distribution in a portion other than the end portions. The same reference numerals as in the first embodiment denote the same components and a description thereof will be omitted. Only parts different from the first embodiment will be explained.

Figure 11:
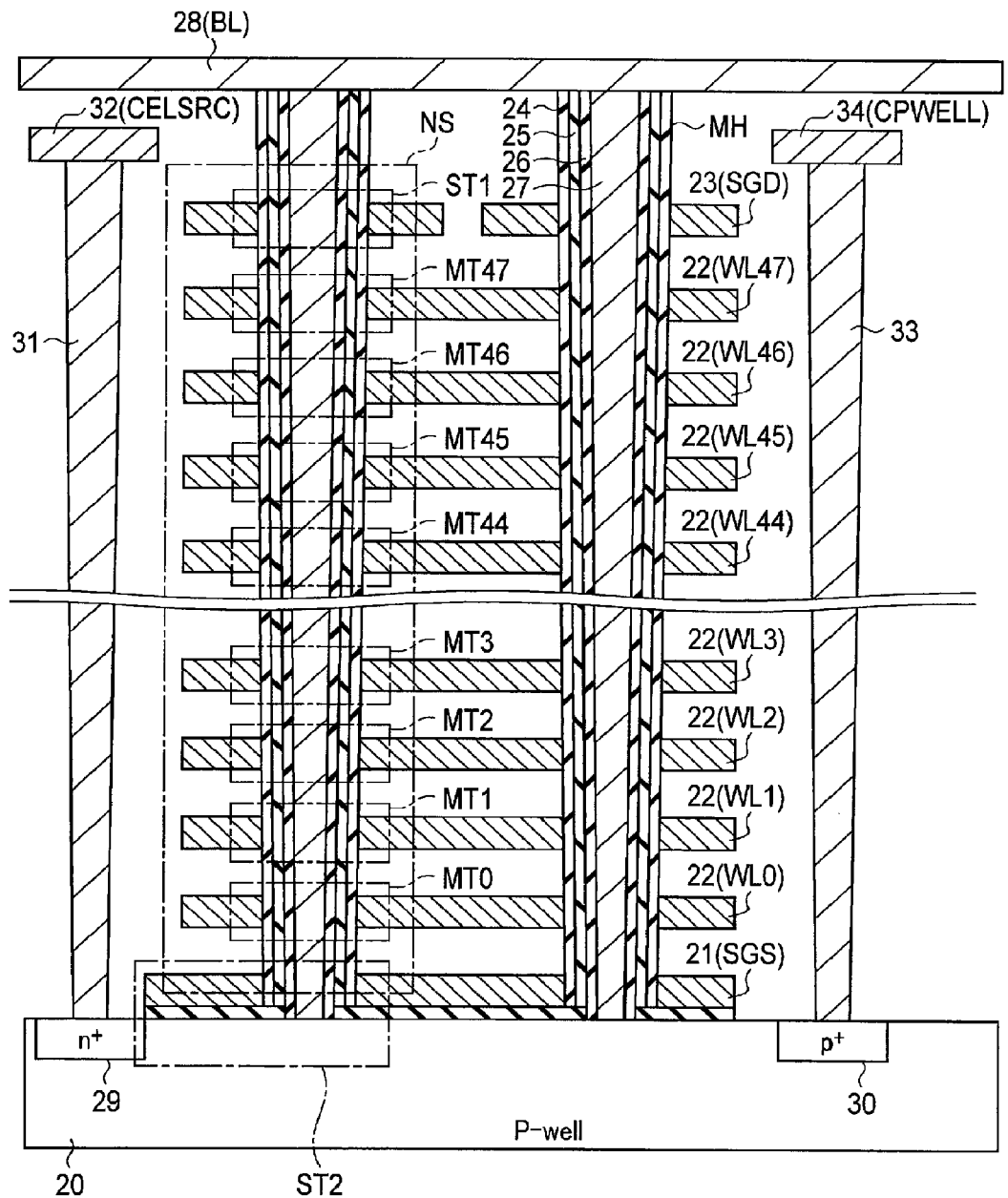
FIG. 11 is a sectional view showing part of the configuration of the memory cell array of a semiconductor storage device according to a second embodiment.

2.1 Configuration
2.1.1 Configuration of Memory Cell Array
The configuration of the memory cell array of the semiconductor storage device according to the second embodiment will be described with reference to FIG. 11. FIG. 11 shows an example of the sectional structure of part of the memory cell array of the semiconductor storage device according to the second embodiment. Particularly, FIG. 11 shows strings NS in each of two string units SU in one block BLK and an associated portion, similarly to FIG. 3.

As shown in FIG. 11, each of a plurality of memory holes MH has a tapered shape instead of the bow shape described with reference to FIG. 3. That is, the diameter of each memory hole MH increases from bottom to top. More specifically, the diameter of each memory hole MH is smallest in an interconnection layer 22(WL0), and is largest in an interconnection layer 22(WL47). Since the diameter of the memory hole MH differs along the Z direction, the word line WL-dependence of the characteristic of the threshold voltage is common to the first embodiment. On the other hand, the second embodiment is different from the first embodiment in that the diameter of the memory hole MH monotonically increases upward. A change in characteristic of the threshold voltage can be different from that in the first embodiment. More specifically, the difference between the characteristics of the threshold voltages can become large even in a layer (for example, the interconnection layers 22(WL2) to 22(WL45)) near the center of the NAND string NS 2.2 Zones
Zones applied to the semiconductor storage device according to the second embodiment will be described. FIG. 12 is a block diagram showing an example of the configuration of the voltage generator of the semiconductor storage device according to the second embodiment.

As shown in FIG. 12, word line drivers 16w are classified into four zones Zn2 (Zn20 to Zn23) in a program verify operation. More specifically, word line drivers 16w0 and 16w1 are classified into the zone Zn20. Word line drivers 16w2 to 16w23 are classified into the zone Zn21. Word line drivers 16w24 to 16w45 are classified into the zone Zn22. Word line drivers 16w46 and 16w47 are classified into the zone Zn23.

Figure 13:
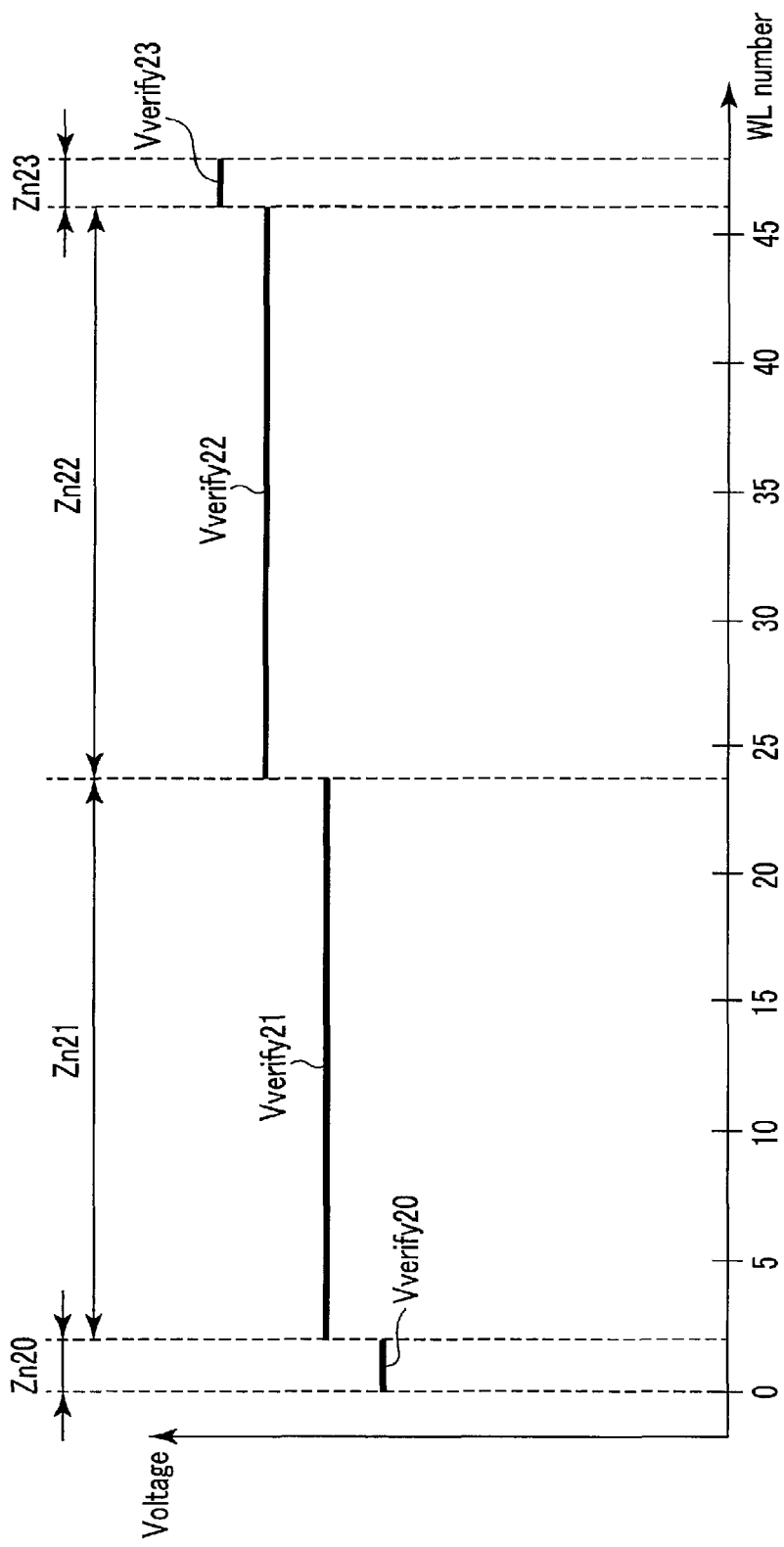
FIG. 13 is a diagram showing a zone table applied to the semiconductor storage device according to the second embodiment.

FIG. 13 is an example of a diagram schematically showing contents of a zone table applied at the time of the program verify operation of the semiconductor storage device according to the second embodiment. As shown in FIG. 13, at the time of the program verify operation, a verify voltage Vverify 21 is applied to the word lines WL2 to WL23 corresponding to the zone Zn21. A verify voltage Vverify20 lower than the verify voltage Vverify21 is applied to the word lines WL0 and WL1 corresponding to the zone Zn20. A verify voltage Vverify22 higher than the verify voltage Vverify21 is applied to the word lines WL24 to WL45 corresponding to the zone Zn22. A verify voltage Vverify23 higher than the verify voltage Vverify22 is applied to the word lines WL46 and WL47 corresponding to the zone Zn23.

Figure 14:
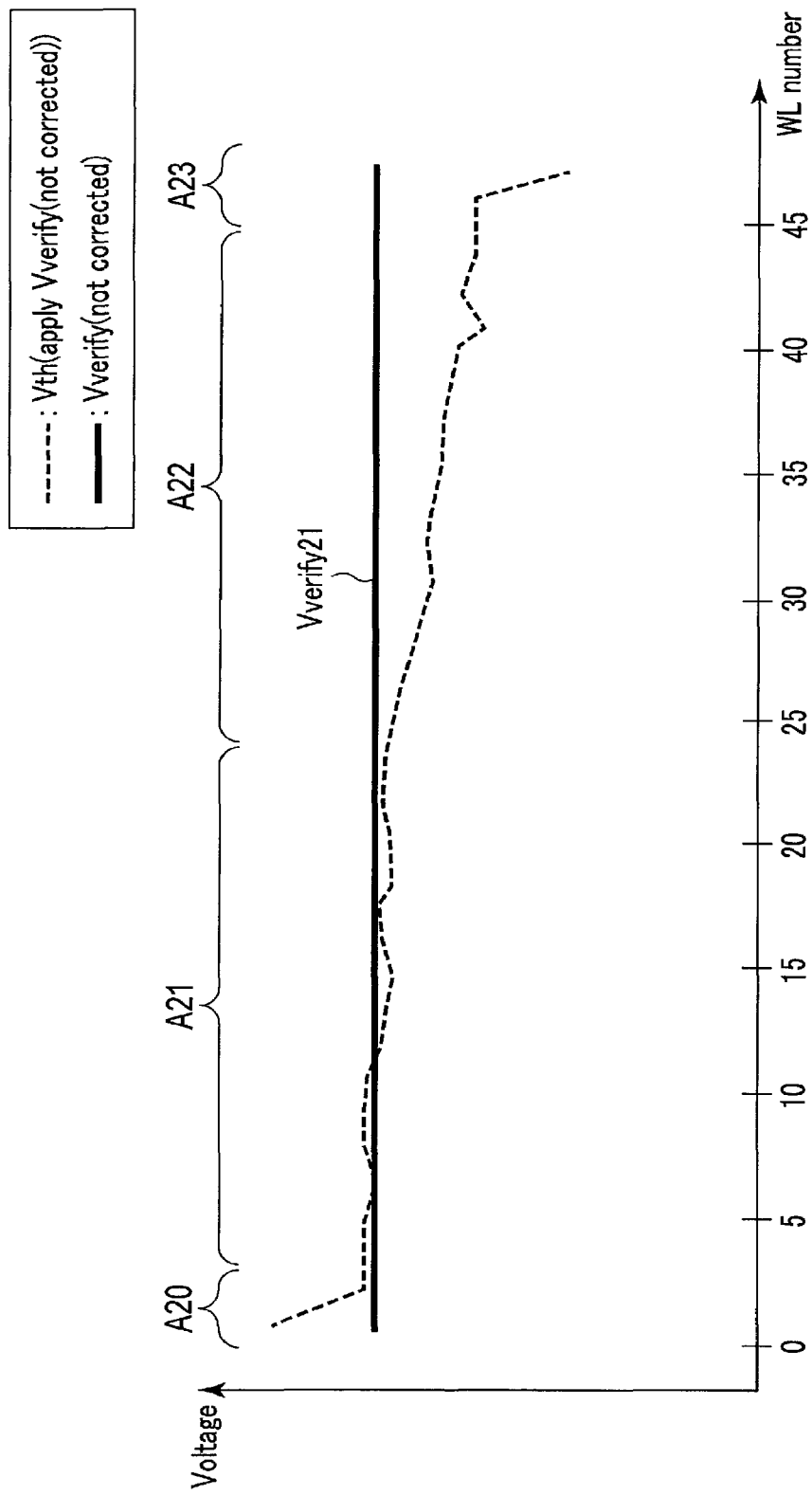
FIG. 14 is a diagram showing a threshold voltage distribution for respective word lines when the verify voltage of the semiconductor storage device is not corrected according to the second embodiment.

2.3 Effect of Embodiment
FIG. 14 is a diagram showing an example of a threshold voltage distribution for the respective word lines when the verify voltage of a semiconductor storage device 1 is not corrected according to the second embodiment. Referring to FIG. 14, data write is performed to all memory cell transistors MT of the semiconductor storage device 1 using the same verify voltage Vverify21. After that, the threshold voltages at the time of data read are classified for the respective word lines. As shown in FIG. 14, if the same verify voltage Vverify21 is used, the threshold voltages of the NAND string NS decrease from an end region A20 to an end region A23. More specifically, the threshold voltages in a central region A21 are distributed around the verify voltage Vverify21. The threshold voltages in the end region A20 largely increase with respect to the verify voltage Vverify21. On the other hand, the threshold voltages in a central region A22 and the end region A23 decrease with respect to the verify voltage Vverify21. The threshold voltages in the end region A23 largely decrease with respect to the threshold voltages in the central region A22. In this case, a variation in the threshold voltage distribution in another region with respect to the threshold voltages in the central region A21 becomes large not only in the end regions A20 and A22 but also in the central region A22.

In the configuration according to the second embodiment, at the time of the program verify operation when data of the same level are written, a verify voltage of a value for each zone is used. For example, the semiconductor storage device 1 according to the second embodiment applies the verify voltages to the end regions A20 and A23 and the central regions A21 and A22 based on the zone table for defining the different zones Zn20 to Zn23. More specifically, the different verify voltages Vverify20 and Vverify23 different from those for the zones Zn21 and Zn22 are applied to the zones Zn20 and Zn23, respectively. The different verify voltages Vverify21 and Vverify22 are applied to the zones Zn21 and Zn22, respectively. This can more accurately correct the variation in the threshold voltage distribution occurring in the NAND string.

FIG. 15 is a diagram showing an example of the threshold voltage distribution for the respective word lines after the verify voltage of the semiconductor storage device 1 is corrected according to the second embodiment. FIG. 15 shows a variation in the threshold voltage distribution for the respective word lines when the verify voltages Vverify20 to Vverify 23 are applied to the zones Zn20 to Zn23, respectively. As shown in FIG. 15, the verify voltage Vverify20 is lower than the verify voltage Vverify21. The verify voltage Vverify22 is higher than the verify voltage Vverify21. The verify voltage Vverify23 is higher than the verify voltage Vverify22. The memory cell transistors MT in the zone Zn22 pass the program verify operation in a state in which more charges are accumulated, as compared with a case in which the verify voltage Vverify21 is set. The memory cell transistors MT in the zone Zn23 pass the program verify operation in a state in which more charges are accumulated, as compared with a case in which the verify voltage Vverify22 is set. After that, the threshold voltages of the memory cell transistors MT in the zone Zn22 decrease. The threshold voltages of the memory cell transistors MT in the zone Zn23 decrease more than those of the memory cell transistors MT in the zone Zn22. As a result, the threshold voltages in the zones Zn22 and Zn23 are distributed around the verify voltage Vverify21. That is, the threshold voltages of all the memory cell transistors MT are corrected so that they do not to depend on the word lines WL at the time of data read. Therefore, at the time of data read, it is possible to correct the variation in the threshold voltage distribution, which occurs in a region except for the end portions of the NAND string, in addition to those in the end portions.

3. Third Embodiment

A semiconductor storage device according to the third embodiment will be described next. The NAND string of the semiconductor storage device according to the third embodiment reduces a variation in a threshold voltage distribution at the time of data read when it has a U shape instead of a columnar shape. In the following description, the same reference numerals as in the first embodiment denote the same components and a description thereof will be omitted. Only differences from the first embodiment will be explained.

3.1 Configuration of NAND String

The configuration of a NAND string NS of the semiconductor storage device according to the third embodiment will be described with reference to FIG. 16. FIG. 16 shows an example of the sectional structure of part of the NAND string of the semiconductor storage device according to the third embodiment. Particularly, FIG. 16 shows the NAND string NS in each of two string units SU in one block BLK and an associated portion, similarly to FIG. 3.

As shown in FIG. 16, the NAND string NS is provided above a semiconductor substrate (not shown), and includes a backgate transistor layer L1, a memory cell transistor layer L2, a select transistor layer L3, and an interconnection layer L4.

The backgate transistor layer L1 functions as a backgate transistor. The memory cell transistor layer L2 functions as memory cell transistors MT. The select transistor layer L3 functions as select transistors ST1 and ST2. The interconnection layer L4 functions as a source line CELSRC and bit lines BL.

The backgate transistor layer L1 is provided above the semiconductor substrate, and includes a conductive layer 35. A backgate hole BH is formed within the upper surface of the conductive layer 35. The conductive layer 35 functions as a gackgate line. The conductive layer 35 two-dimensionally spreads on the X-Y plane, and is divided for each block BLK.

The memory cell transistor layer L2 is provided above the backgate transistor layer L1. The memory cell transistor layer L2 includes interconnection layers 22. That is, the interconnection layers 22 respectively functioning as word lines WL23 to WL0 and the interconnection layers 22 respectively functioning as word lines WL24 to WL47 are individually stacked on the conductive layer 35. Insulating films (not shown) are provided between the stacked interconnection layers 22. The interconnection layers 22 respectively functioning as the word lines WL23 to WL0 and the interconnection layers 22 respectively functioning as the word lines WL24 to WL47 are divided by an insulating film (not shown). The interconnection layers 22 extend in, for example, the X direction.

The select transistor layer L3 is provided above the memory cell transistor layer L2. The select transistor layer L3 includes an interconnection layer 21 functioning as a select gate line SGS and an interconnection layer 23 functioning as a select gate line SGD. The interconnection layer 21 is stacked above the interconnection layer 22 functioning as the word line WL0. The interconnection layer 23 is stacked above the interconnection layer 22 functioning as the word line WL47. The interconnection layers 21 and 23 are divided by an insulating film (not shown). The interconnection layers 21 and 23 extend in, for example, the X direction.

The memory cell transistor layer L2 and the select transistor layer L3 include memory holes MH1 and MH2, respectively. The memory hole MH1 is formed to reach the backgate hole BH through the interconnection layer 21 and the interconnection layers 22 respectively functioning as the word lines WL0 to WL23. The memory hole MH2 is formed to reach the backgate hole BH through the interconnection layer 23 and the interconnection layers 22 respectively functioning as the word lines WL47 to WL24.

A block insulating film 24, a charge accumulation layer (insulating film) 25, and a tunnel oxide film 26 are sequentially provided on the side surfaces of the backgate hole BH and the memory holes MH1 and MH2. A semiconductor film 36 is buried in the backgate hole BH. A semiconductor pillar 27 is buried in each of the memory holes MH1 and MH2. The lower end of each semiconductor pillar 27 is in contact with the semiconductor film 36. The semiconductor film 36 and the semiconductor pillars 27 are made of, for example, an undoped polysilicon, and function as the current path of the NAND string NS. An interconnection layer 32 functioning as the source line CELSRC is provided at the upper end of the semiconductor pillar 27 buried in the memory hole MH1. A contact 37 is provided at the upper end of the semiconductor pillar 27 buried in the memory hole MH2. An interconnection layer 28 functioning as the bit lines BL is provided on the upper surface of the contact 37.

As described above, the backgate transistor, the plurality of memory cell transistors MT, and the select transistors ST1 and ST2 are sequentially stacked above the semiconductor substrate. The two memory holes MH1 and MH2 and the backgate hole BH connecting the memory holes MH1 and MH2 correspond to one NAND string NS.

Note that the shape of each of the memory holes MH1 and MH2 can be nonuniformly formed over a plurality of different positions in the Z direction mainly due to a manufacturing step. For example, each of the memory holes MH1 and MH2 has a bow shape, similarly to the first embodiment. More specifically, the diameter of the memory hole MH1 is largest in a layer (for example, the interconnection layer 22(WL12)) near the center of the interconnection layers 22, and decreases toward the end portions in the Z direction. That is, the change rate of the diameter of the memory hole MH1 is locally highest in the interconnection layers 22(WL0) and 22(WL23) as the end portions. The diameter of the memory hole MH2 is largest in a layer (for example, the interconnection layer 22(WL35)) near the center of the interconnection layers 22, and decreases toward the end portions in the Z direction. That is, the change rate of the diameter of the memory hole MH2 is locally highest in the interconnection layers 22(WL47) and 22(WL24) as the end portions. The diameter of each of the memory holes MH1 and MH2 differs along the Z direction.

That is, the threshold voltage characteristics of the memory cell transistors MT according to the third embodiment can have word line WL-dependence. Especially, the threshold voltage characteristics of the memory cell transistors MT can largely change in the interconnection layers 22 (for example, near the interconnection layers 22(WL0) and 22(WL47) or near the interconnection layers 22(WL23) and 22(WL24)) in the end portions of the memory holes MH1 and MH2.

Furthermore, the plurality of memory holes MH1 and MH2 arrayed on the semiconductor substrate have, for example, the same shape. Thus, the memory holes MH1 and MH2 can have the same word line WL-dependence in the Z direction. Therefore, the memory cell transistors MT0 to MT23 of the memory hole MH1 and the memory cell transistors MT47 to MT24 of the memory hole MH2 can exhibit the same threshold voltage characteristic in the word lines WL of the same layer.

3.2 Zones

Zones applied to the semiconductor storage device according to the third embodiment will be described next. FIG. 17 is a block diagram showing an example of the configuration of the voltage generator of the semiconductor storage device according to the third embodiment.

As shown in FIG. 17, word line drivers 16w are classified into four zones Zn3 (Zn30 to Zn33) in a program verify operation. More specifically, word line drivers 16w0, 16w1, 16w46, and 16w47 are classified into the zone Zn30. Word line drivers 16w2 to 16w12 and 16w35 to 16w45 are classified into the zone Zn31. Word line drivers 16w13 to 16w21 and 16w26 to 16w34 are classified into the zone Zn32. Word line drivers 16w22 to 16w25 are classified into the zone Zn33.

Figure 18:
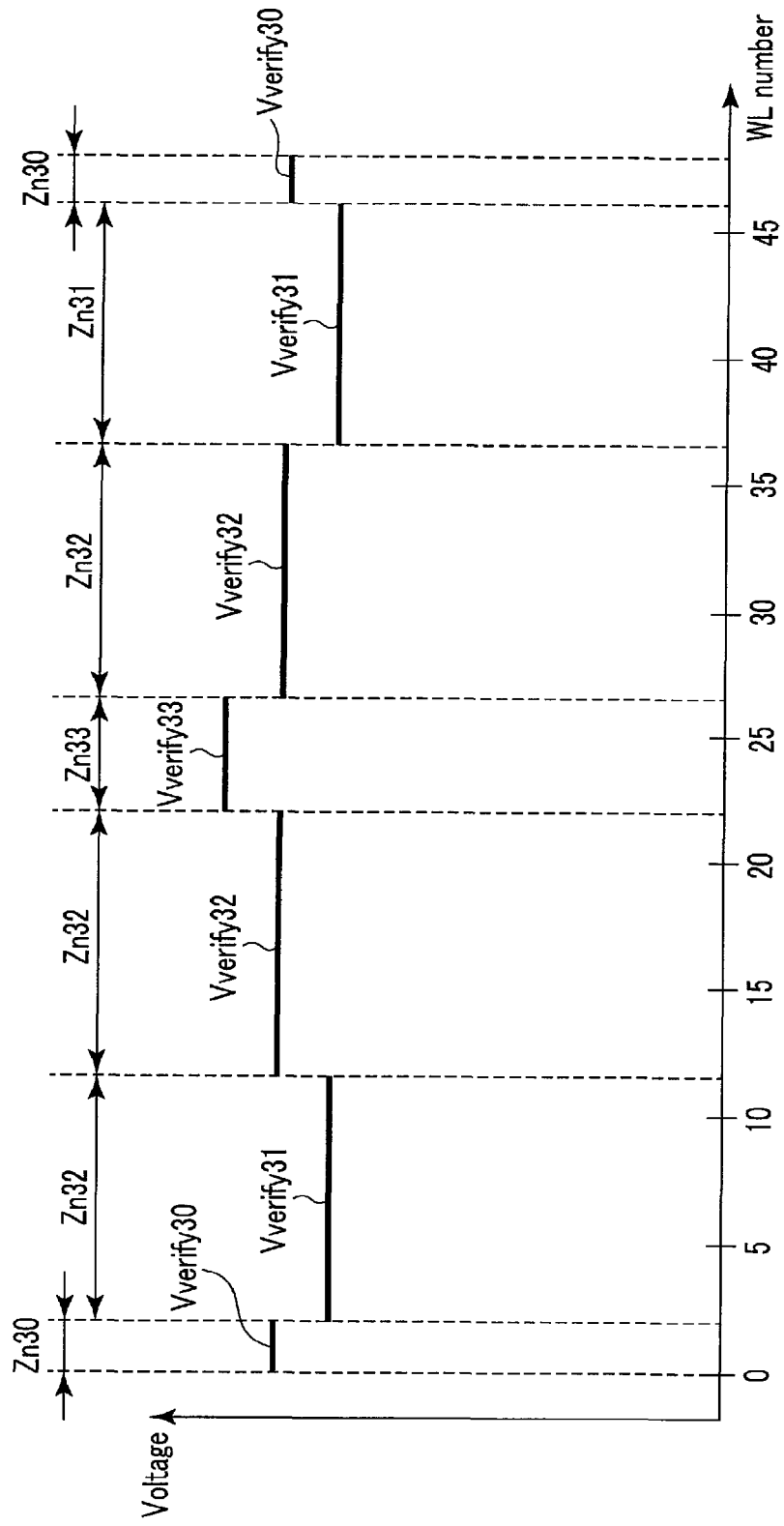
FIG. 18 is a diagram showing a zone table applied to the semiconductor storage device according to the third embodiment.

FIG. 18 is an example of a diagram schematically showing contents of a zone table applied at the time of the program verify operation of the semiconductor storage device according to the third embodiment. As shown in FIG. 18, at the time of the program verify operation, a verify voltage Vverify 31 is applied to the word lines WL2 to WL12 and WL35 to WL45 corresponding to the zone Zn31. A verify voltage Vverify30 higher than the verify voltage Vverify31 is applied to the word lines WL0, WL1, WL46, and WL47 corresponding to the zone Zn30. A verify voltage Vverify32 higher than the verify voltage Vverify31 is applied to the word lines WL13 to WL21 and WL26 to WL34 corresponding to the zone Zn32. A verify voltage Vverify33 higher than the verify voltage Vverify32 is applied to the word lines WL22 to WL25 corresponding to the zone Zn33.

3.3 Effect of Embodiment

Figure 19:
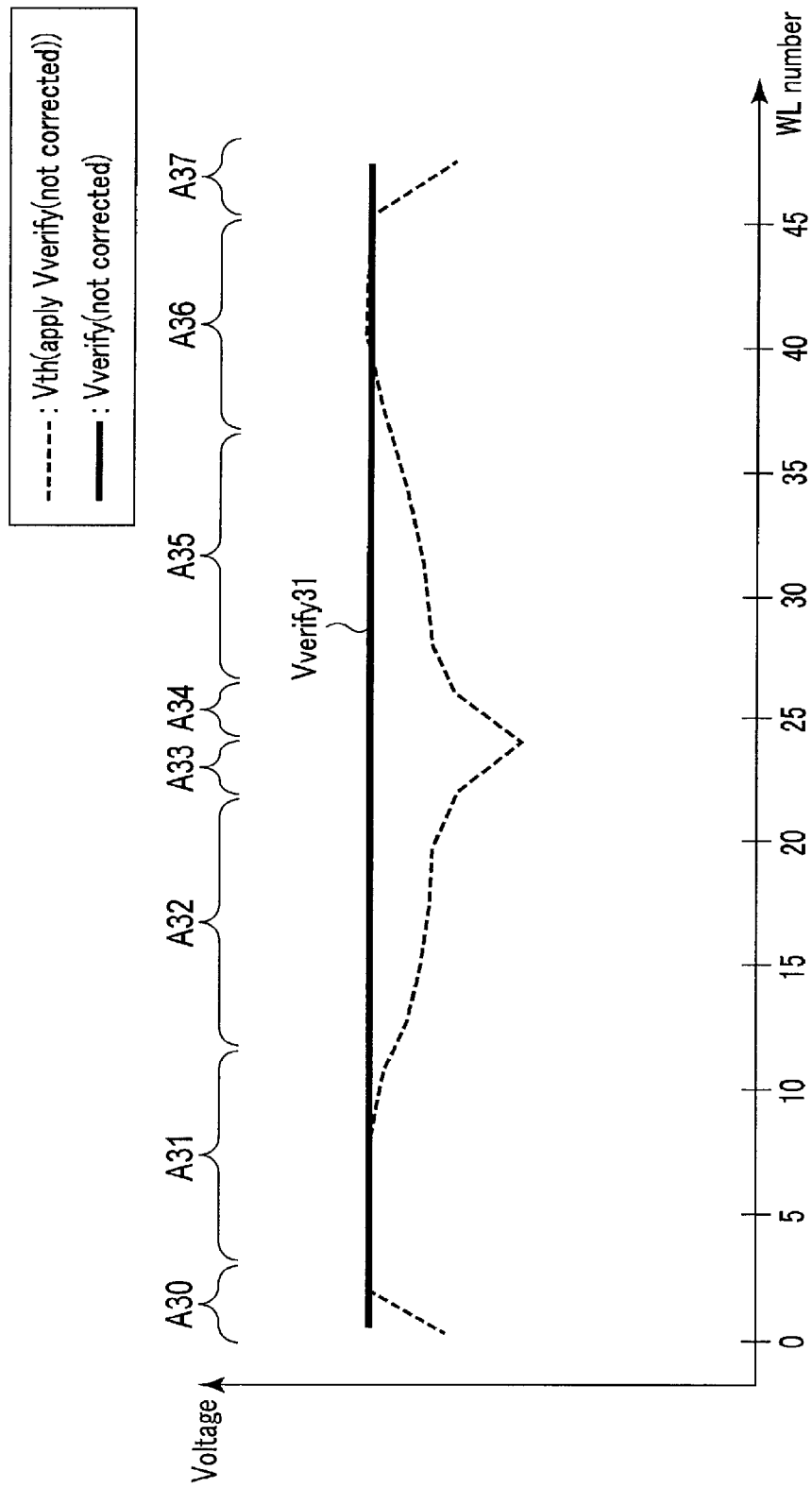
FIG. 19 is a diagram showing a threshold voltage distribution for respective word lines when the verify voltage of the semiconductor storage device is not corrected according to the third embodiment.

FIG. 19 is a diagram showing an example of the threshold voltage distribution for the respective word lines when the verify voltage of a semiconductor storage device 1 is not corrected according to the third embodiment. Referring to FIG. 19, data write is performed to all the memory cell transistors MT of the semiconductor storage device 1 using the same verify voltage Vverify31. After that, the threshold voltages at the time of data read are classified for the respective word lines. If the same verify voltage Vverify31 is used, the threshold voltages of the NAND string NS symmetrically vary in a range from an end region A30 to an end region A33, which corresponds to the memory hole MH1, and a range from an end region A34 to an end region A37, which corresponds to the memory hole MH2, as shown in FIG. 19. More specifically, the threshold voltages in central regions A31 and A36 are distributed around the verify voltage Vverify31. The threshold voltages in the end regions A30 and A37 largely decrease with respect to the verify voltage Vverify31. On the other hand, the threshold voltages in central regions A32 and A35 and the end regions A33 and A34 decrease with respect to the verify voltage Vverify31. Especially, the threshold voltages in the end regions A33 and A34 more largely decrease with respect to the threshold voltages in the central regions A32 and A35. This is because the two memory holes MH1 and MH2 have the threshold voltage characteristics indicating the same variation tendency in the Z direction.

In the configuration according to the third embodiment, the verify voltage of the value for each zone is used at the time of the program verify operation when the data of the same level are written. For example, in the semiconductor storage device 1 according to the third embodiment, the end regions A30 and A37, the central regions A31 and A36, the central regions A32 and A35, and the end regions A33 and A34 are respectively classified into the zones Zn30 to Zn33. More specifically, the individual verify voltages Vverify30 to Vverify33 are applied to the zones Zn30 to Zn33, respectively, at the time of the program verify operation. This can accurately correct the variation in the threshold voltage distribution, which occurs in the NAND string NS.

FIG. 20 is a diagram showing an example of the threshold voltage distribution for the respective word lines after the verify voltage of the semiconductor storage device 1 is corrected according to the third embodiment. FIG. 20 shows a variation in the threshold voltage distribution for the respective word lines when the verify voltages Vverify30 to Vverify 33 are applied to the zones Zn30 to Zn33, respectively. As shown in FIG. 20, the verify voltage Vverify30 is higher than the verify voltage Vverify31. The verify voltage Vverify32 is higher than the verify voltage Vverify31. The verify voltage Vverify33 is higher than the verify voltage Vverify32. This causes the memory cell transistors MT in the zones Zn30 and Zn32 to pass the program verify operation in a state in which more charges are accumulated, as compared with a case in which the verify voltage Vverify31 is set. Furthermore, the memory cell transistors MT in the zone Zn33 pass the program verify operation in a state in which more charges are accumulated, as compared with a case in which the verify voltage Vverify32 is set. After that, the threshold voltages of the memory cell transistors MT in the zones Zn30 and Zn32 decrease due to their characteristics. The threshold voltages of the memory cell transistors MT in the zone Zn33 decrease more than those of the memory cell transistors MT in the zone Zn32 due to their characteristics. As a result, the threshold voltages in the zones Zn30, Zn32, and Zn33 are distributed around the verify voltage Vverify31. That is, the threshold voltages of all the memory cell transistors MT are corrected so that they do not to depend on the word lines WL at the time of data read. Therefore, it is possible to suppress a state in which the threshold voltages not only in the end portions of the NAND string NS but also in a region except for the end portions excessively vary at the time of data read. Even the memory cell transistors MT which are not adjacent to each other are classified into the same zone as long as they are provided in the same layer in the Z direction. Consequently, it is possible to correct a variation in the threshold voltage distribution of the memory cell transistors MT in the NAND string NS using a smaller number of zones.

4. Modifications and Others

The embodiments are not limited to the forms described in the above first to third embodiments, and various modifications can be made.

4.1 First Modification

FIG. 21 shows an example of the sectional structure of part of the memory cell array of a semiconductor storage device according to the first modification. As shown in FIG. 21, each of a plurality of memory holes MH may have a bow shape in which a diameter becomes small near the center of the memory hole MH, instead of the bow shape, described with reference to FIG. 3, in which the diameter becomes large near the center. More specifically, the diameter of the memory hole MH is smallest near an interconnection layer 22(WL23), and increases toward the end portions. The change rate of the diameter of the memory hole MH from the interconnection layer 22(WL23) to an interconnection layer 22(WL0) is different that of the diameter of the memory hole MH from the interconnection layer 22(WL23) to an interconnection layer 22(WL47). More specifically, the diameter of the memory hole MH is larger in the interconnection layer 22(WL47) than in the interconnection layer 22(WL0).

Figure 22:
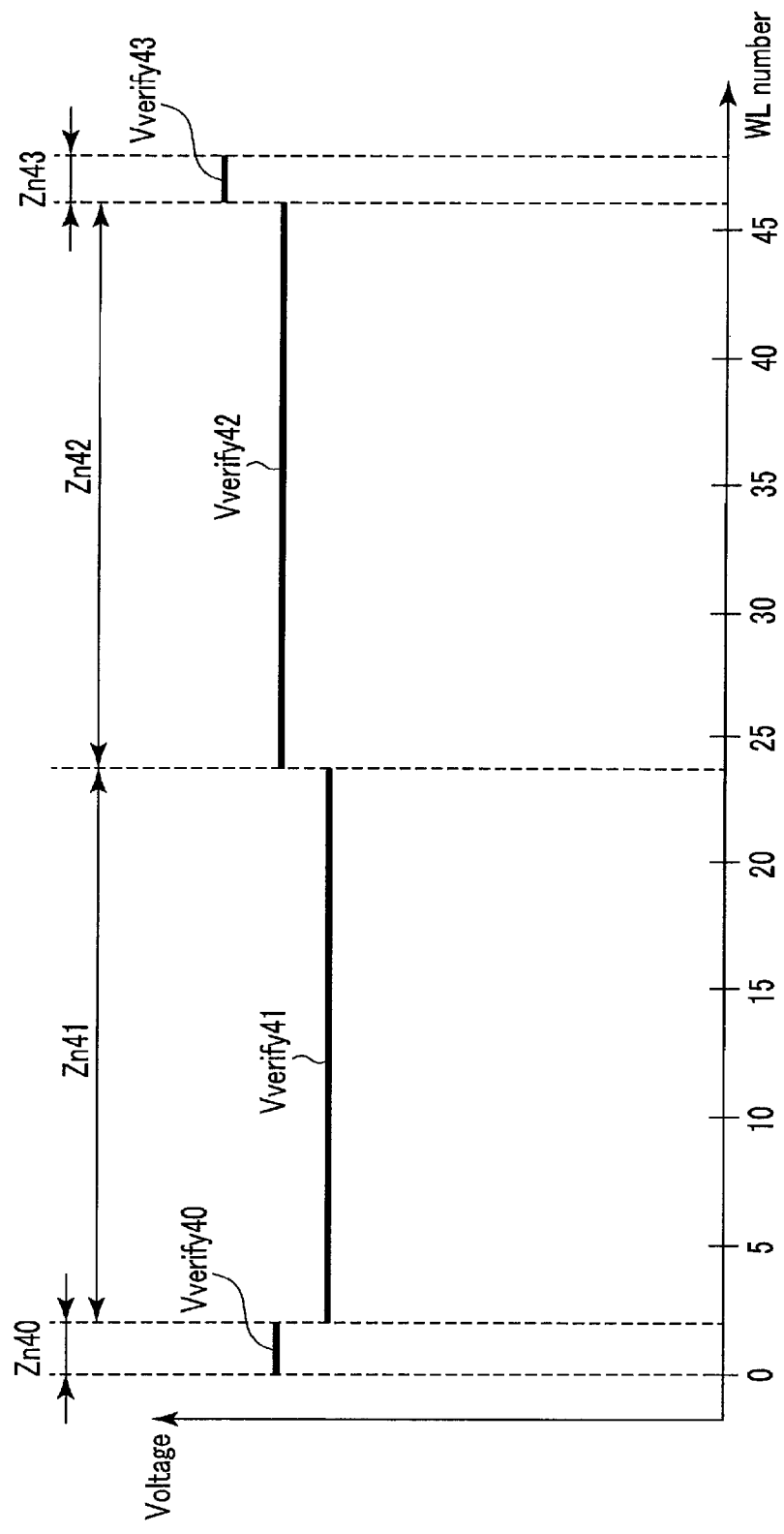
FIG. 22 is a diagram showing a zone table applied to the semiconductor storage device according to the first modification.

FIG. 22 is an example of a diagram schematically showing contents of a zone table applied at the time of the program verify operation of the semiconductor storage device according to the first modification. As shown in FIG. 22, at the time of the program verify operation, a verify voltage Vverify41 is applied to word lines WL2 to WL23 corresponding to a zone Zn41. A verify voltage Vverify40 higher than the verify voltage Vverify41 is applied to word lines WL0 and WL1 corresponding to a zone Zn40. A verify voltage Vverify42 higher than the verify voltage Vverify41 is applied to word lines WL13 to WL21 corresponding to a zone Zn42. A verify voltage Vverify43 higher than the verify voltage Vverify42 is applied to word lines WL46 and WL47 corresponding to a zone Zn43.

According to the first modification, even if a variation in a threshold voltage distribution is different from that in each embodiment, a variation in a threshold distribution depending on the word lines WL can be corrected. In addition, if the magnitude of the diameter of the memory hole MH has a positive correlation with the variation in the threshold voltage distribution, the variation in the threshold voltage distribution becomes larger, for example, from a memory cell transistor MT23 to a memory cell transistor MT0. Furthermore, the variation in the threshold voltage distribution becomes larger, for example, from the memory cell transistor MT23 to a memory cell transistor MT47. The variation in the threshold voltage distribution is larger in the upper portion than in the lower portion with respect to the memory cell transistor MT23. That is, in the first modification, the magnitude of the variation in the threshold voltage distribution does not consistently increase or decrease from the lower end of the NAND string to its upper end. In this case as well, by setting the zones Zn40 to Zn43 in the end regions and the plurality of divided central regions of the NAND string NS, it is possible to apply the verify voltages Vverify40 to Vverify43 in accordance with the magnitude of the variation in the threshold voltage distribution. Therefore, it is possible to more accurately correct the variation in the threshold voltage distribution, which occurs in the NAND string.

4.2 Second Modification

FIG. 23 shows an example of the sectional structure of part of the memory cell array of a semiconductor storage device according to the second modification. As shown in FIG. 23, each of a plurality of memory holes MH has a tapered shape in which a diameter increases from top to bottom, instead of the tapered shape, described with reference to FIG. 11, in which the diameter increases from bottom to top. More specifically, the diameter of the memory hole MH is largest in an interconnection layer 22(WL0), and is smallest in an interconnection layer 22(WL47). Therefore, the threshold voltage characteristic can change differently from the second embodiment. More specifically, the threshold voltage characteristic can vary in a direction opposite to that in the second embodiment along the Z direction.

Figure 24:
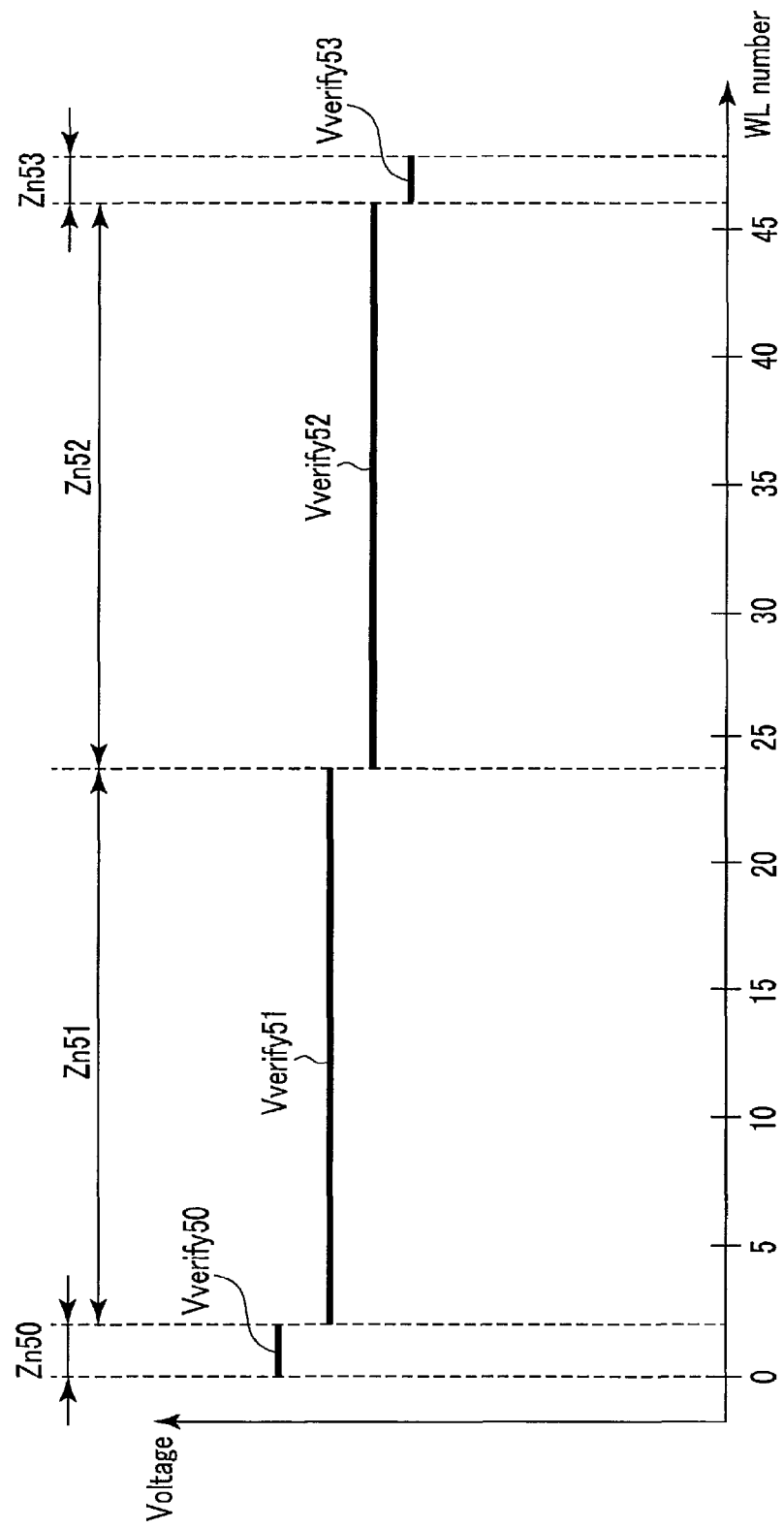
FIG. 24 is a diagram showing a zone table applied to the semiconductor storage device according to the second modification.

FIG. 24 is an example of a diagram schematically showing an example of a zone table applied at the time of the program verify operation of the semiconductor storage device according to the second modification. As shown in FIG. 24, at the time of the program verify operation, a verify voltage Vverify51 is applied to word lines WL2 to WL23 corresponding to a zone Zn51. A verify voltage Vverify50 higher than the verify voltage Vverify51 is applied to word lines WL0 and WL1 corresponding to a zone Zn50. A verify voltage Vverify52 lower than the verify voltage Vverify51 is applied to word lines WL13 to WL21 corresponding to a zone Zn52. A verify voltage Vverify53 lower than the verify voltage Vverify52 is applied to word lines WL46 and WL47 corresponding to a zone Zn53. According to the second modification, even if a variation in the threshold voltage distribution is opposite to that in the second embodiment, it is possible to correct a variation in a threshold distribution depending on the word lines WL.

4.3 Others

Each of the first to third embodiments and the first and second modifications has described an MLC (Multi-Level Cell) in which each memory cell transistor MT can store 2-bit data (4-level data). The present invention, however, is not limited to this. For example, the memory cell transistor MT can store 3- or more-bit data. A TLC (Triple-Level Cell) capable of storing 3-bit data, a QLC (Quadruple-Level Cell) capable of storing 4-bit data, or a cell capable of storing 5- or more-bit data may be used. The NAND string NS is not limited to the MLC, and may include memory cell transistors MT (SLC: Single-Level Cell) each storing 1-bit data. The memory cell transistors MT of the SLC are provided in, for example, the end portions of the NAND string NS. In this case, the zone table set in each of the first to third embodiments and the first and second modifications may be set in only the MLC. This makes it possible to execute appropriate correction for the MLC in which a requirement for a threshold voltage distribution at the time of data read is stricter than in the SLC.

Furthermore, in each of the first to third embodiments and the first and second modifications, the two memory cell transistors MT (MT0 and MT1 or MT46 and MT47) at the end of the memory hole MH are classified into the same zone as an end portion. The present invention, however, is not limited to this. For example, the number of memory cell transistors MT classified into the zone of the end region may be one or three or more. The number of the memory cell transistors MT in the end region may be different between the upper and lower ends of the memory hole MH. Furthermore, the example in which the central region is divided into two zones by setting the memory cell transistor MT23 as a boundary has been explained. The present invention, however, is not limited to this. Division of the end regions and the central regions can be determined based on, for example, the magnitude of a variation in the threshold voltage distribution. The memory cell transistors MT whose magnitudes of the variations in threshold voltage distributions when the same verify voltage is applied are closest to the settable verify voltage may be classified into the same zone. For example, the memory cell transistors MT may be classified into a plurality of zones in accordance with the magnitude of a shift, from a given standard value, of the variation in the threshold voltage distribution when the same verify voltage is applied.

In each of the first to third embodiments and the first and second modifications, one zone table has been exemplified for one shape of the memory hole MH. However, combination of the memory hole MH and the zone table is not limited to this, and an arbitrary combination is applicable. That is, the magnitude of a verify voltage for each zone need only be set depending on the magnitude of a variation in the threshold voltage distribution, and may be set independently of the shape of the memory hole MH.

In addition, the following matters are applicable in each of the embodiments and modifications.

In a multi-level read operation (read), a voltage applied to a word line selected in a read operation of A-level is, for example, 0 V to 0.55 V. The voltage is not limited to this, and may be 0.1 V to 0.24 V, 0.21 V to 0.31 V, 0.31 V to 0.4 V, 0.4 V to 0.5 V, or 0.5 V to 0.55 V.

A voltage applied to a word line selected in a read operation of B-level is, for example, 1.5 V to 2.3 V. The voltage is not limited to this, and may be 1.75 V to 1.8 V, 1.8 V to 1.95 V, 1.95 V to 2.1 V, or 2.1 V to 2.3 V.

A voltage applied to a word line selected in a read operation of C-level is, for example, 3.0 V to 4.0 V. The voltage is not limited to this, and may be 3.0 V to 3.2 V, 3.2 V to 3.4 V, 3.4 V to 3.5 V, 3.5 V to 3.7 V, or 3.7 V to 4.0 V.

The time (tR) of the read operation can be, for example, 25 μs to 38 μs, 38 μs to 70 μs, or 70 μs to 80 μs.

A write operation includes a program operation and a verify operation. In the write operation, a voltage first applied to a selected word line at the time of the program operation is, for example, 13.7 V to 14.3 V. The voltage is not limited to this, and may be, for example, 13.7 V to 14.0 V or 14.0 V to 14.7 V.

A voltage first applied to a selected word line when writing to an odd-numbered word line and a voltage first applied to a selected word line when writing to an even-numbered word line may be different.

When the program operation is performed by the ISPP (Incremental Step Pulse Program) method, a step-up voltage is, for example, about 0.5 V.

The voltage applied to an unselected word line may be, for example, 7.0 V to 7.3 V. The voltage is not limited to this, and may be, for example, 7.3 V to 8.4 V, or 7.0 V or less.

The pass voltage to be applied may be changed depending on whether the unselected word line is an odd-numbered word line or an even-numbered word line.

The time (tProg) of the write operation can be, for example, 1,700 μs to 1,800 μs, 1,800 μs to 1,900 μs, or 1,900 μs to 2,000 μs.

In an erase operation, a voltage first applied to a well formed in the upper portion of the semiconductor substrate and having a memory cell arranged above is, for example, 12 V to 13.7 V. The voltage is not limited to this, and may be, for example, 13.7 V to 14.8 V, 14.8 V to 19.0 V, 19.0 V to 19.8 V, 19.8 V to 21 V.

The time (tErase) of the erase operation can be, for example, 3,000 μs to 4,000 μs, 4,000 μs to 5,000 μs, or 4,000 μs to 9,000 μs.

A memory cell includes a charge accumulation layer arranged on a 4 to 10 nm thick tunnel insulating film on the semiconductor substrate (silicon substrate). The charge accumulation layer can have a stacked structure including a 2 to 3 nm thick insulating film made of SiN, SiON, or the like and a 3 to 8 nm thick polysilicon film. A metal such as Ru may be added to polysilicon. An insulating film is formed on the charge accumulation layer. This insulating film includes, for example, a 4 to 10 nm thick silicon oxide film sandwiched between a 3 to 10 nm thick lower high-k film and a 3 to 10 nm thick upper high-k film. The high-k films are made of, for example, HfO. The silicon oxide film can be thicker than the high-k films. A 30 to 70 nm thick control electrode is formed on a 3 to 10 nm thick material to adjust the work function of the insulating film. The material for work function adjustment is a metal oxide film such as TaO or a metal nitride film such as TaN. W or the like can be used for the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:

1. A semiconductor storage device comprising:
a NAND string including
a first set of memory cell transistors including a first memory cell transistor, and
a second set of memory cell transistors including a second memory cell transistor disposed above the first memory cell transistor,
wherein a number of memory cell transistors included in the first set is different from a number of memory cell transistors included in the second set, and
during a program verify operation when a data item of a level is written to a memory cell transistor of the first set and a memory cell transistor of the second set, a first verify voltage is applied to a gate of the memory cell transistor of the first set, and a second verify voltage different from the first verify voltage is applied to a gate of the memory cell transistor of the second set.

2. The device of claim 1, wherein
the NAND string further includes a third set of memory cell transistors including a third memory cell transistor disposed above the second memory cell transistor,
a number of memory cell transistors included in the third set is different from the number of memory cell transistors included in the second set, and
during another program verify operation when the data item of the level is written to the memory cell transistor of the second set and a memory cell transistor of the third set, a third verify voltage different from the second verify voltage is applied to a gate of the memory cell transistor of the third set.

3. The device of claim 1, wherein
the NAND string further includes a backgate transistor disposed below the first memory cell transistor,
the first set further includes a fourth memory cell transistor disposed in a same layer as that of the first memory cell transistor above the backgate transistor, and
the second set further includes a fifth memory cell transistor disposed in a same layer as that of the second memory cell transistor above the fourth memory cell transistor.

4. The device of claim 3, wherein
the NAND string further includes a third set including a third memory cell transistor disposed above the second memory cell transistor, and a sixth memory cell transistor disposed in a same layer as that of the third memory cell transistor above the fifth memory cell transistor,
a number of memory cell transistors included in the third set is different from the number of memory cell transistors included in the second set, and
during another program verify operation when the data item of the level is written to the memory cell transistor of the second set and a memory cell transistor of the third set, a third verify voltage different from the second verify voltage is applied to a gate of the memory cell transistor of the third set.

5. The device of claim 1, wherein the NAND string includes a bow shape.

6. The device of claim 1, wherein the NAND string includes a tapered shape.

7. The device of claim 1, wherein a memory hole diameter of the memory cell transistor included in the first set is smaller than a memory hole diameter of the memory cell transistor included in the second set.

8. The device of claim 7, wherein the first verify voltage is higher than the second verify voltage.

9. The device of claim 7, wherein the first verify voltage is lower than the second verify voltage.

10. The device of claim 1, wherein a memory hole diameter of the memory cell transistor included in the first set is larger than a memory hole diameter of the memory cell transistor included in the second set.

11. The device of claim 10, wherein the first verify voltage is higher than the second verify voltage.

12. The device of claim 10, wherein the first verify voltage is lower than the second verify voltage.

* * * * *